United States Patent [19]
Merrill

[11] Patent Number: 6,069,376
[45] Date of Patent: *May 30, 2000

[54] INTRA-PIXEL FRAME STORAGE ELEMENT, ARRAY, AND ELECTRONIC SHUTTER METHOD INCLUDING SPEED SWITCH SUITABLE FOR ELECTRONIC STILL CAMERA APPLICATIONS

[75] Inventor: Richard B. Merrill, Woodside, Calif.

[73] Assignee: Foveonics, Inc., Santa Clara, Calif.

[*] Notice: This patent issued on a continued prosecution application filed under 37 CFR 1.53(d), and is subject to the twenty year patent term provisions of 35 U.S.C. 154(a)(2).

[21] Appl. No.: 09/048,921

[22] Filed: Mar. 26, 1998

[51] Int. Cl.$^7$ ........................ H01L 31/062; H01L 31/113
[52] U.S. Cl. ........................ 257/291; 257/290; 257/294
[58] Field of Search ........................ 257/291, 290, 257/292, 294, 222, 298, 223, 229, 230, 231, 232, 233, 228; 438/109, 110

[56] References Cited

U.S. PATENT DOCUMENTS

| | | | |
|---|---|---|---|
| 3,934,161 | 1/1976 | Claywood | 307/311 |
| 3,988,619 | 10/1976 | Malaviya et al. | 307/311 |
| 4,363,963 | 12/1982 | Ando | 250/211 |

(List continued on next page.)

FOREIGN PATENT DOCUMENTS

| | | | |
|---|---|---|---|
| 0777379 | 6/1997 | European Pat. Off. | H04N 3/15 |
| 54-108628 | of 1979 | Japan | G03B 7/20 |
| 58-83824 | of 1983 | Japan | G03B 7/20 |
| 59-152424 | of 1984 | Japan | G03B 7/20 |
| 59-42527 | of 1984 | Japan | G03B 17/14 |
| 60-23841 | of 1985 | Japan | G03B 17/14 |
| 60-53912 | of 1985 | Japan | G02B 7/11 |

OTHER PUBLICATIONS

Chye Huat Aw, et al. "A 128×128–Pixel Standard CMOS Image Sensor with Electronic Shutter" IEEE International Solid State Circuits Conference vol. 39, pp. 180–181, 440 Feb. 1996.

R.M. Guidash, et al. "A 0.6 um CMOS Pinned Photodiode Color Imager Technology" IEDM pp. 927–929 1997.

Abbas El Garmal, et al. "Modeling and Estimation of FPN Components in CMOS Image Sensors" Information Systems Laboratory, Stanford University pp. 1–10 1987.

(List continued on next page.)

Primary Examiner—Carl Whitehead, Jr.
Assistant Examiner—S. V. Clark
Attorney, Agent, or Firm—Sierra Patent Group, Ltd.

[57] ABSTRACT

A storage pixel sensor disposed on a semiconductor substrate comprises a MOS capacitor storage element having a diffusion terminal and a gate terminal. A speed node is connected to the diffusion terminal and biased at either a first control potential or a second control potential, the first potential selected to keep the MOS capacitor in a state of inversion, the second potential selected to keep the MOS capacitor in a state of depletion. A photodiode has an anode connected to a reference potential and a cathode. A semiconductor reset switch has a first terminal connected to the cathode and a second terminal connected to a reset reference potential. A semiconductor transfer switch has a first terminal connected to the cathode and a second terminal connected to the gate terminal of the capacitive storage element. A semiconductor amplifier has an input connected to the gate terminal of the capacitive storage element and an output. The semiconductor reset switch and the semiconductor transfer switch each have a control element connected to a control circuit for selectively activating the semiconductor reset switch and the semiconductor transfer switch. A light shield is disposed over a portion of the semiconductor substrate including the second terminal of the semiconductor transfer switch to prevent substantially all photons from entering the portion of the semiconductor substrate. Structures are present for preventing substantially all minority carriers generated in the semiconductor substrate from entering the portion of the semiconductor substrate. A plurality of storage pixel sensors are disposed in an array.

26 Claims, 11 Drawing Sheets

U.S. PATENT DOCUMENTS

| | | | |
|---|---|---|---|
| 4,499,529 | 2/1985 | Figueroa | 362/283 |
| 4,573,077 | 2/1986 | Imai | 358/212 |
| 4,626,915 | 12/1986 | Takatsu | 358/213 |
| 4,654,714 | 3/1987 | Hurst, Jr. et al. | 358/213 |
| 4,742,238 | 5/1988 | Sato | 250/578 |
| 4,809,075 | 2/1989 | Akimoto et al. | 358/213.18 |
| 4,843,474 | 6/1989 | Suzuki | 358/213.19 |
| 4,901,129 | 2/1990 | Hynecek | 357/30 |
| 4,942,473 | 7/1990 | Zeevi et al. | 358/213.26 |
| 5,117,292 | 5/1992 | Matsunaga | 358/213.19 |
| 5,276,521 | 1/1994 | Mori | 358/213.31 |
| 5,317,174 | 5/1994 | Hynecek | 257/222 |
| 5,335,015 | 8/1994 | Cooper et al. | 348/302 |
| 5,341,008 | 8/1994 | Hynecek | 257/231 |
| 5,424,223 | 6/1995 | Hynecek | 437/3 |
| 5,428,390 | 6/1995 | Cooper et al. | 348/240 |
| 5,434,620 | 7/1995 | Higuchi et al. | 348/308 |
| 5,471,245 | 11/1995 | Cooper et al. | 348/302 |
| 5,541,402 | 7/1996 | Ackland et al. | 250/208.1 |
| 5,576,763 | 11/1996 | Ackland et al. . | |
| 5,602,585 | 2/1997 | Dickinson et al. . | |
| 5,625,210 | 4/1997 | Lee et al. | 257/292 |
| 5,631,704 | 5/1997 | Dickinson et al. . | |
| 5,712,682 | 1/1998 | Hannah | 348/255 |
| 5,739,562 | 4/1998 | Ackland et al. . | |

OTHER PUBLICATIONS

Alex Dickinson, et al. "TP 13.5: A 256×256 CMOS Active Pixel Image Sensor with Motion Detection" IEEE International Solid–State Circuits Conference pp. 226–227 1995.

Andrew J. Blanksby, et al. "Noise Performance of a color CMOS Photogate Image Sensor" IEEEE pp. 205–208 1997.

Author Unknown, "Tittle Unknown" IEDM pp. 202–204 1997.

Bernward Rossler "Electrically Erasable and Reprogrammable Read–Only Memory Using the n–Channel SIMOS One–Transistor Cell" IEEE Transactions on Electron Devices vol. ED–24, No. 5 pp. 606–610 May 1977.

Carver A. Mead, et al. "Scanners for Visualizing Activity of Analog VLSI Circuitry" California Institute of Technology Computation and Neural Systems Program pp. 1–29 Jul. 5, 1991.

Eric R. Fossum "Active Pixel Sensors: Are CCD's Dinosaurs?" SPIE vol. 1900 pp. 2–14.

Hon–Sum Philip Wong, et al. CMOS Active Pixel Image Sensors Fabricated Using a 1.8–V, 0.25–um CMOS Technology pp. 889–894 IEEE Transactions on Electron Devices vol. 45 No. 4 Apr. 1998.

Hon–Sum Philip Wong "CMOS Image Sensors—Recent Advances and Device Scaling Considerations" IEEE pp. 201–204 1997.

Orly Yadid–Pecht, et al. "A Random Access Photodiode Array for Intelligent Image Capture" IEEE Transactions on Electron Devices, vol. 38 No. 8 pp. 1772–1780 Aug. 1991.

R. Daniel McGrath, et al. "FA 11.2: Current–Mediated, Current–Reset 768×512 Active Pixel Sensor Array" IEEE/ Slide Supplement pp. 182–183 & 138–139.

R. Panicacci, et al. "1/4–Inch CMOS Active Pixel Sensor with Smart On–Chip Functions and Full Digital Interface" Hot Chips IX pp. 41–54 Aug. 25–26 1997.

S. Decker et, al. "A 256×256 CMOS Imaging Array with Wide Dynamic Range Pixels and Column–Parallel Digital Output" IEEE International Solid–State Circuits Conference pp. 176–177 1998.

Stephen John Decker "A Wide Dynamic Range CMOS Imager With Parallel On–Chip Analog–to–Digital Conversion" pp. 1–205 1997.

Sunetra K. Mendis et, al "A 128 × 128 CMOS Active Pixel Image Sensor for Highly Integrated Imaging Systems" IEEE pp. 583–586 1993.

T. Delbruck et, al "Analog VLSI Phototransduction by continuous–time, adaptive, logarithmic photoreceptor circuits" California Institute of Technology Computation and Neural Systems Program CNS Memo No. 30 Apr. 2, 1996 pp. 1–24.

Tatsuo Nomoto, et al. "FA 11.4: A 4M–Pixel Image Sensor with Block and step Access Capability" IEEE International pp. 186–187 Plus Four Additional Slides 1997.

Tobi Delbruck, et al. "Analog VLSI Adaptive, Logarithmic, Wide–Dynamic–Range Photoreceptor" ISCAS '94 Proceedings of the Int'l Symposium on Circuits and Systems IEEE London, May 1994.

Yoshiaki Hagiwara, Member, IEEE "High–Density and High–Quality Frame Transfer CCD Imager with Very Low Smear, Low Dark Current, and Very High Blue Sensitivity" IEEE Transactions on Electron Devices, vol. 43 No. 12 pp. 2122–2130 Dec. 1996.

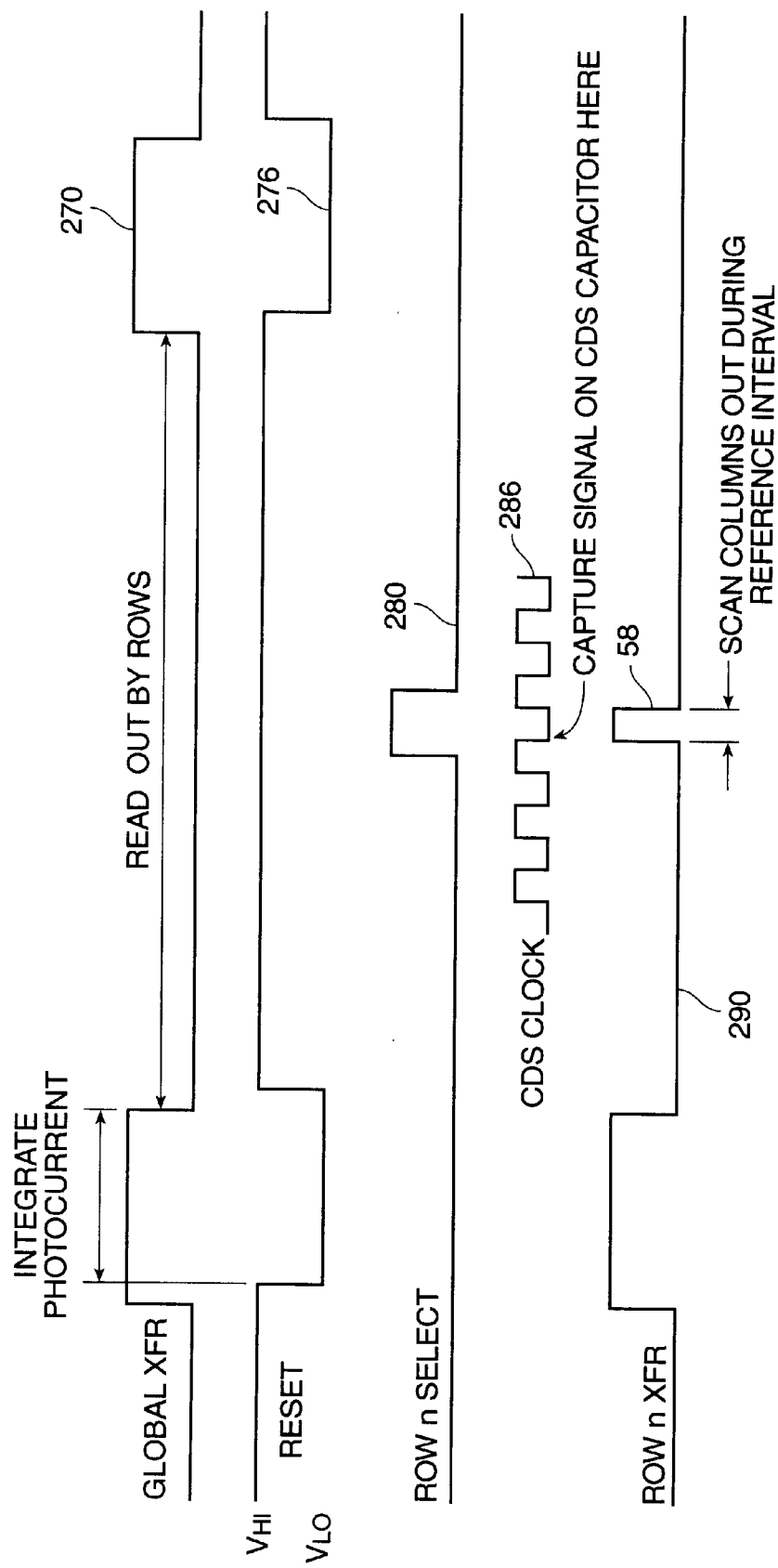

INTRA-PIXEL FRAME STORAGE ELEMENT, ARRAY, AND ELECTRONIC SHUTTER METHOD INCLUDING SPEED SWITCH SUITABLE FOR ELECTRONIC STILL CAMERA APPLICATIONS

BACKGROUND OF THE INVENTION

1. Field of the Invention

The present invention relates to image sensor arrays. More particularly, the present invention relates to CMOS image sensor arrays for still camera applications and to methods for operating those arrays.

2. The Prior Art

Integrated image sensors are known in the art. Such sensors have been fabricated from charge-coupled devices (CCDs) and as bipolar and MOS image sensors.

In the CCD imager art, on-chip frame storage capability has been employed previously. It has been motivated by the need to shift sensed charges out during a video frame time without letting them be contaminated by further exposure as the charges travel across the CCD array. Two storage techniques are commonly employed in the CCD imager art. According to the first technique, a second separate on-chip CCD array is provided under a light shield, and the entire image is quickly shifted along one dimension into the storage array, since shifting in one dimension is fast enough to avoid significant contamination. According to the second technique, line-storage CCDs are provided between the lines of sensors, with local light shielding. In the CCD art, techniques have been developed for preventing leakage and contamination due to minority carrier diffusion and leakage, but these techniques are not applicable to the CMOS sensor array because the silicon fabrication processes are different.

In still-camera applications with randomly-addressable CMOS active-pixel sensors, the problem of how to implement a short-exposure interval with a long readout interval exists. A typical active-pixel area-array image sensor is disclosed in Hurwitz et al., "An 800K-Pixel Color CMOS Sensor For Consumer Still Cameras", SPIE Vol. 3019, pp 115–124 and comprises a plurality of rows and columns of pixel sensors. The most common method of exposure for this type of sensor array is to cyclicly scroll through the rows so that the integration duration for each row is the same, but can be shorter than the total readout interval. This method of exposure control is known as an electronic shutter.

There are two problems with this type of electronic shutter. First, since each row scans a different time interval, there will be motion artifacts (the shape of moving objects will be distorted). In addition, this scheme requires a very high conversion rate analog-to-digital converter (ADC) implementation. For example, if the array has 1 million pixels, and the readout duration is 1/100 sec (about the maximum acceptable for a hand-held the required conversion rate is 100 million samples/sec. Since the state of the art for commercial ADCs with the required accuracy (10 bits) is about 20 million samples/sec, this means that a total of 5 ADCs would have to be used to allow for 1/100 sec exposures.

Another solution to the exposure problem is to provide a mechanical shutter for the camera. In this mode of operation, the entire array is first reset simultaneously. Then the shutter is opened for the duration of the exposure. After the shutter is closed, readout out can take place a relatively slow rate limited only by the dark current error in the pixels. However mechanical shutters add to the cost and complexity of the camera, and also contribute to camera shake.

Prior art in CMOS storage pixels has not yet addressed the problem of leakage and contamination, even though the problem has been noted. In the paper Yadid-Pecht et al., "A Random Access Photodiode Array for Intelligent Image Capture", IEEE Trans. Electron Devices vol. 38 no. 8 August 1991 pp 1772–1779, a prior-art storage pixel is described. The imager disclosed therein is motivated by the need to access pixel values in random order for certain processing functions, as opposed to being motivated by the need to have a readout interval longer than the exposure interval in high resolution still photography. Yadid-Pecht et al. describe the problems of "crosstalk" and "leakage" being "much stronger than predicted," but they do not offer any specific ideas on how to ameliorate these problems.

The pixel layout in this prior-art imager shows that the authors did not find a strategy for protecting the sensitive storage node from stray carrier diffusion, nor from light. They reference three papers from the CCD art for "technological solutions" to these problems, but the CCD art referenced does not obviously apply to the problem of CMOS storage pixels.

Another area of concern in electronic cameras is the ability to provide for the concept analogous to selectable film speed in conventional cameras (i.e., ASA or ISO film ratings). It would be advantageous if such functionality could be provided easily in a manner which does not adversely affect integrated circuit layout area for the imaging array.

It is therefore an object of the present invention to provide a pixel sensor and an array of pixel sensors that overcome some of the shortcomings of the prior art.

A further object of the present invention is to provide a storage-pixel sensor and an imaging array of storage-pixel sensors that overcomes the scanout problems inherent in prior-art imaging arrays.

Another object of the present invention is to provide an improved electronic shutter method for use with storage-pixel sensors.

Yet another object of the present invention is to provide a storage-pixel sensor and an imaging array of storage-pixel sensors that are compatible with the electronic shutter method of the present invention.

A further object of the invention is to provide a storage-pixel sensor and an imaging array of storage-pixel sensors that incorporate a "film speed" switching capability.

Another object of the invention is to provide a storage-pixel sensor and an imaging array of storage-pixel sensors that incorporate a "film speed" switching capability without adding significantly to the layout area of the imaging array.

BRIEF DESCRIPTION OF THE INVENTION

According to one aspect of the present invention, a storage-pixel sensor and an array of storage-pixel sensors suitable for use in an active-pixel area-array image sensor employing an electronic shutter method are disclosed.

According to a second aspect of the present invention, a method for implementing an electronic shutter having a greatly reduced ADC sample rate requirement is disclosed. The electronic shutter mechanism of the present invention has fewer motion artifacts than prior-art electronic shutter implementations.

According to a third object of the present invention, a storage-pixel sensor and an array of storage-pixel sensors suitable for use in an active-pixel area-array image sensor employing an electronic shutter method and a speed switch are disclosed.

BRIEF DESCRIPTION OF THE DRAWING FIGURES

FIG. 4 is a simplified schematic diagram of a correlated-double-sampling circuit which may be used with the storage-pixel sensor of FIG. 3a.

FIG. 6 is a schematic diagram of an NMOS-switch implementation of the storage-pixel sensor circuit of FIG. 3a.

FIG. 8 is a schematic diagram of a PMOS-switch implementation of the storage-pixel sensor circuit of FIG. 3a.

FIGS. 10a and 10b are, respectively, a more detailed timing diagram of control signals and a schematic diagram of illustrative circuitry for operating an array of storage-pixel sensor arrays according to the present invention.

DETAILED DESCRIPTION OF A PREFERRED EMBODIMENT

Those of ordinary skill in the art will realize that the following description of the present invention is illustrative only and not in any way limiting. Other embodiments of the invention will readily suggest themselves to such skilled persons.

Figure 1:
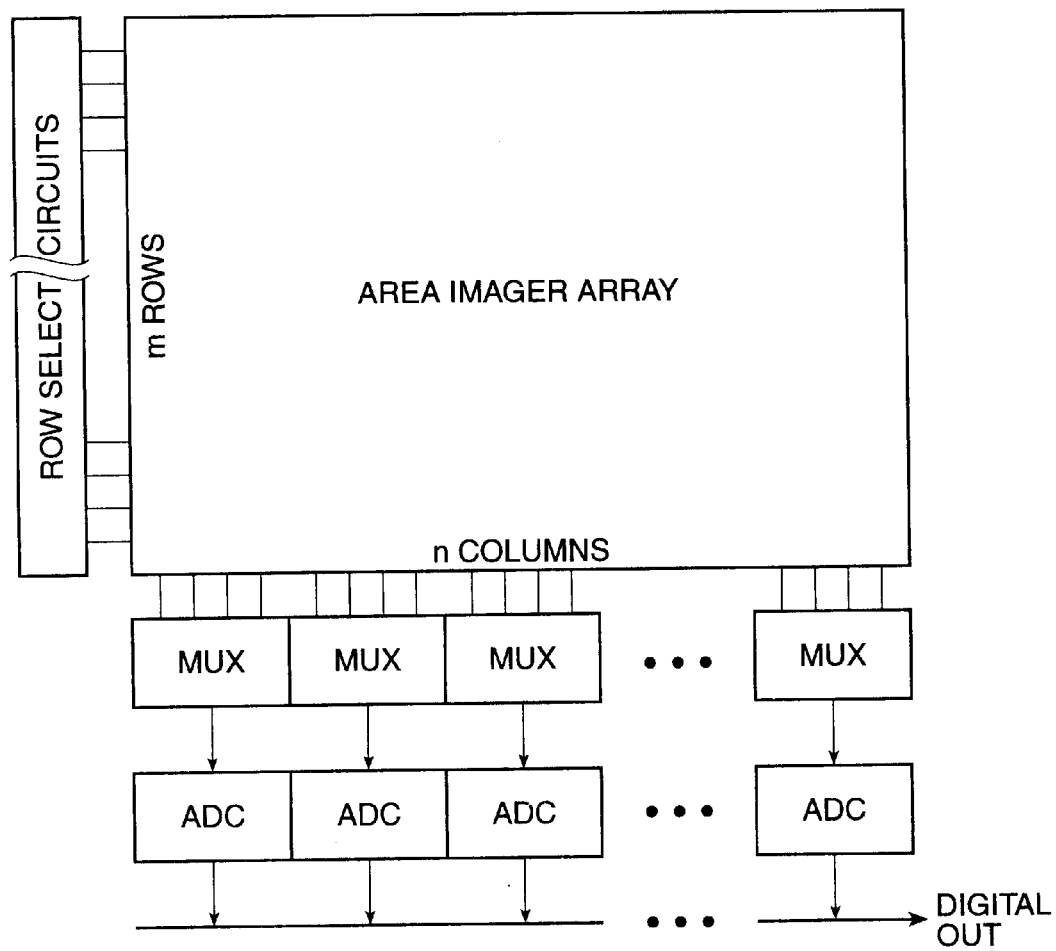
FIG. 1 is a block diagram of a typical prior-art active-pixel area-array image sensor.

To facilitate an understanding of the present invention, an understanding of the operation of prior-art active-pixel area-array image sensors is helpful. Referring first to FIG. 1, a block diagram of a typical prior-art active-pixel area-array image sensor is presented. A pixel array comprises m rows each having n columns of pixel elements.

A row-select circuit (shown at the left side of the array) is provided to scroll through the rows so that the integration duration for each row is the same. For each row, the analog value out of each pixel is multiplexed to ADC circuits to digitize the output values and provide a stream of digital data representing the outputs of the pixels in that row.

Figure 2:
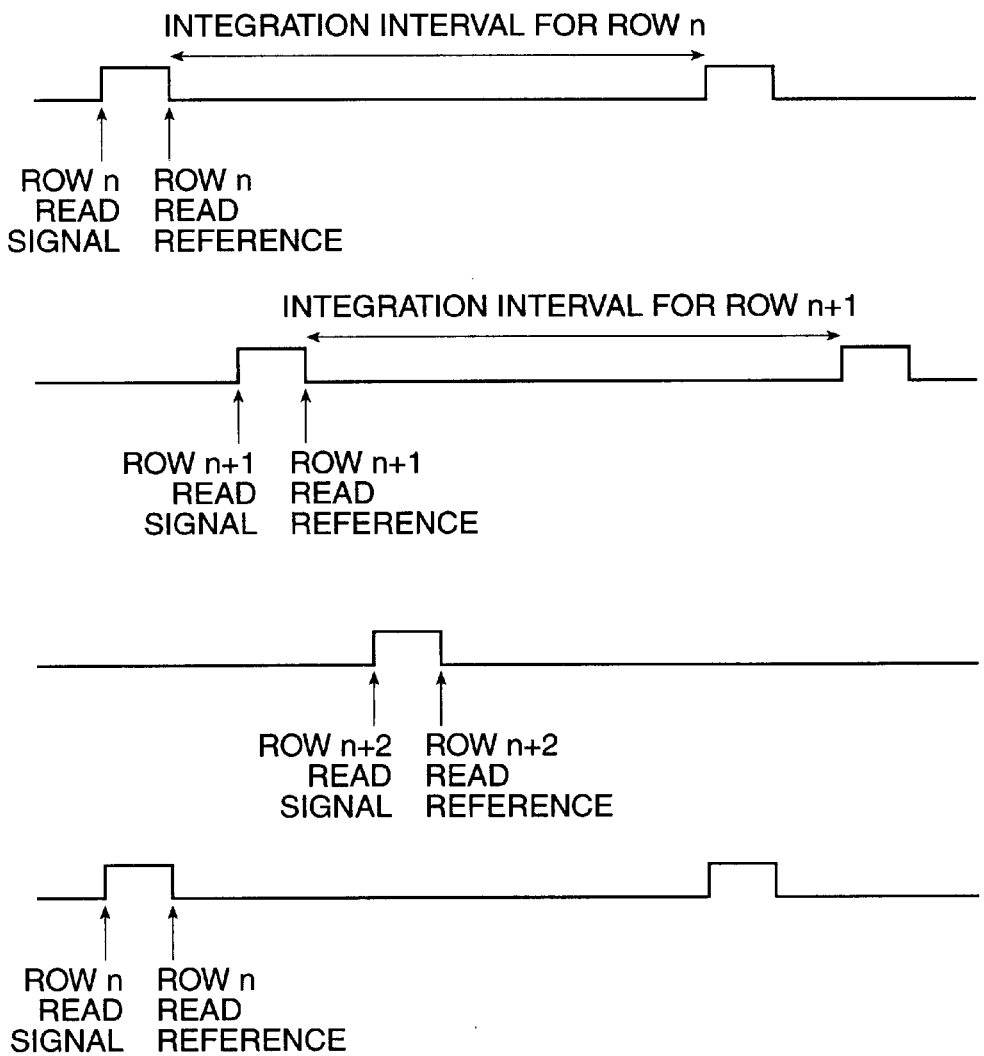
FIG. 2 is a timing diagram showing the common method of exposure for the type of sensor array of FIG. 1 comprising scrolling through the rows so that the integration duration for each row is the same.

Referring now to FIG. 2, a timing diagram shows the common method of exposure for the type of sensor array of FIG. 1. As can be seen from an examination of FIG. 2, the row-select circuits scroll through the rows one at a time so that the integration duration for each row is the same. The time interval between the scanning of the pixels in the first row and the scanning of pixels in the last row of the array of FIG. can be considerable for large arrays, producing undesirable motion artifacts. Motion artifacts can, up to a point, be minimized by increasing the scanning rate of the sensor electronics comprising the multiplexers and ADC circuits, but for larger arrays the increase in scanning speed is limited by the capabilities of the multiplexer and ADC circuits.

Figure 3A:
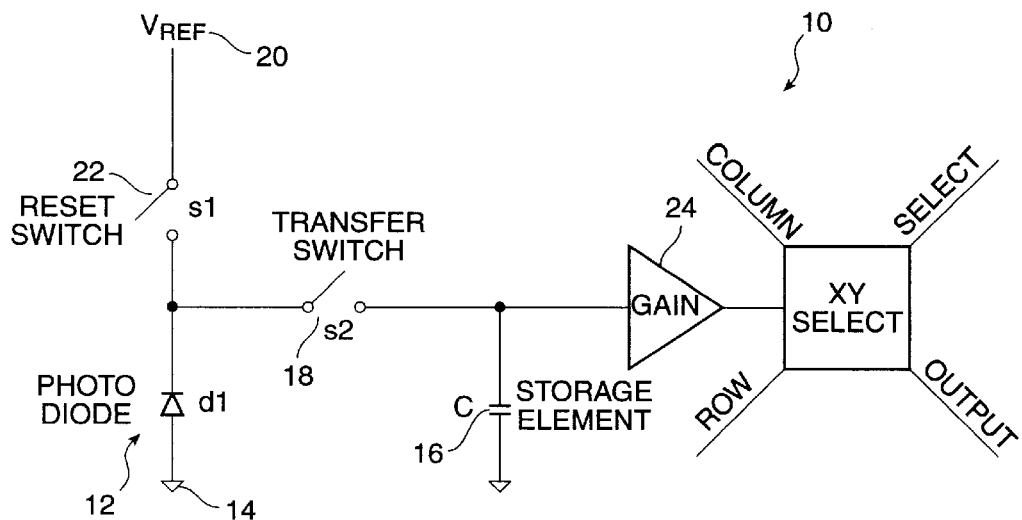
FIG. 3a is a simplified schematic diagram of a storage-pixel sensor according to the present invention.

Referring now to FIG. 3a, a simplified schematic diagram of a storage-pixel sensor suitable for use in the electronic shutter exposure method of the present invention is shown. Storage-pixel sensor 10 comprises a photodiode 12 having its anode connected to a fixed voltage potential 14 (shown in FIG. 3a as ground). The cathode of photodiode 12 is connectable to a storage capacitor 16 via a transfer switch 18. Storage capacitor 16 has a first plate connected to transfer switch 18 and a second plate connected to a fixed potential (shown as ground 14 in FIG. 3a). The cathode of photodiode 12 is also connectable to a reference potential Vref 20 via a reset switch 22 so that the photodiode 12 is reverse biased. An amplifier 24 has its input connected to storage capacitor 16.

Figure 3B:
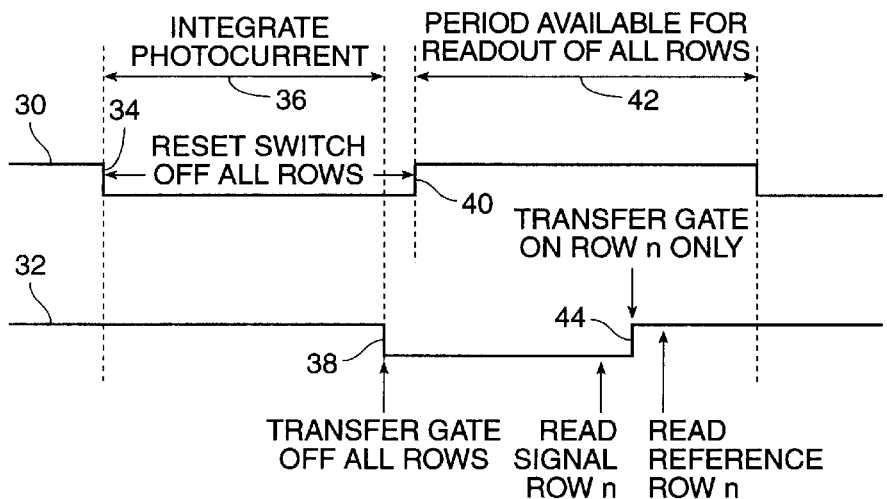
FIG. 3b is a timing diagram showing the exposure method according to the present invention.

FIG. 3b is a timing diagram showing the operation of reset switch 22 (upper trace 30) and transfer switch 18 (lower trace 32). Referring now to both FIGS. 3a and 3b together, the operation of storage-pixel sensor 10 may be readily understood.

First, the pixel 10 is reset by turning on both reset switch 22 and transfer switch 18 as shown by the high level of both reset-switch and transfer-switch traces 30 and 32 of FIG. 3b. Then the reset switch 22 is turned off at falling edge 34 of reset-switch trace 30 so that integration of photocurrent from photodiode 12 can begin. The photocurrent integration period is indicated by arrow 36.

When transfer switch 18 is turned on, the capacitance of the storage capacitor 16 adds to the capacitance of the photodiode 12 during integration, thereby increasing the charge capacity and therefore dynamic range of the storage-pixel sensor. This also reduces variation in the pixel output due to capacitance fluctuations since gate oxide capacitance from which storage capacitor 16 is formed is better controlled than junction capacitance of the photodiode 12.

When the integration is complete (determined by external exposure control), the transfer switch turns off at falling edge 38 of transfer-switch trace 32 of FIG. 3b, isolating the voltage level corresponding to the integrated photocharge onto the storage capacitor 16. Shortly thereafter, the photodiode 12 itself is reset to the reference voltage 20 by again turning on reset switch 24 as indicated by rising edge 40 of upper trace 30 of FIG. 3b. This action will prevent the photodiode 12 from continuing to integrate during the readout process and possibly overflowing excess charge into the substrate which could effect the integrity of the signal on the storage element.

After the reset switch 24 is turned back on, the readout process can begin. The readout period available for reading out all of the storage-pixel sensors in all rows is indicated at arrow 42 of FIG. 3b. As presently preferred, the pixel data value readout is performed using correlated double sampling.

Figure 4:
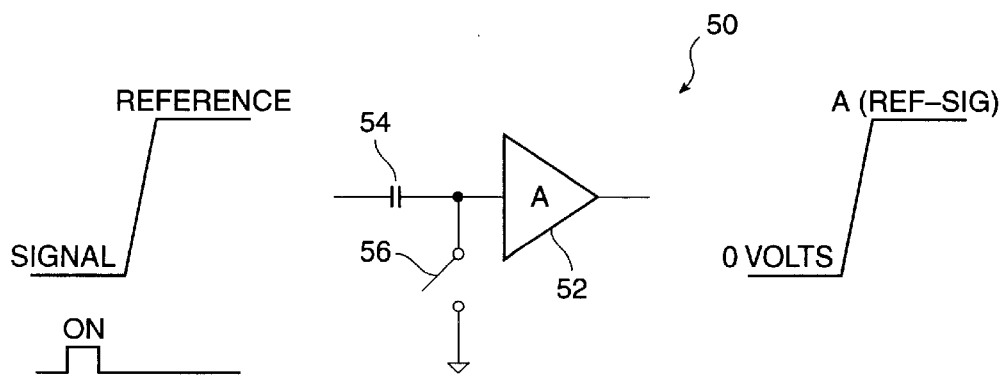

FIG. 4 is a simplified schematic diagram of a correlated double sampling (CDS) circuit 50 which may be used with the storage-pixel sensor of FIG. 3a. CDS circuit 50 comprises an amplifier 52 employing input capacitor 54 having a first plate comprising an input node to the circuit and a second plate connected to the input of amplifier 52. A switch 56 is disposed between the input of amplifier 52 and a fixed reference potential shown as ground in FIG. 4.

The operation of the CDS circuit of FIG. 4 may be understood from the following explanation. First, the signal level for each pixel is read out and stored in the sampling circuitry in the column, controlled by pulse 58 controlling switch 56, as shown in FIG. 4. Then transfer switch 18 is turned on again (for that row only, as seen by rising edge 44 of transfer-switch trace 32 of FIG. 3b) which makes the reference level available to the sampling circuit. This form of double sampling allows for canceling of noise sources in the pixel and column that are slowly varying compared to the time between the two samples.

With the first signal voltage (V1) present on the left of the capacitor 54, switch 56 is on. The voltage stored across capacitor 54 is equal to the signal voltage V1. Then switch 56 is turned off, and the voltage on the first plate of capacitor 54 moves to a new level (V2) representing the reference voltage. The voltage across capacitor 54 will not change during this time because there is negligible current flowing into the amplifier 52 or through switch 56. Thus both plates of capacitor 54 will change by (V2−V1), and the voltage at the input of amplifier 52 at the end of the cycle will be (V2−V1). In this way, noise, offsets, etc can be subtracted from the output of the array.

With the sampling scheme described above, the difference output at the output of amplifier 52 will contain noise from the reset switch 22 of FIG. 3a because the signal contains the reset noise but the reference voltage does not. However, this noise should be fairly repeatable and therefore easily canceled in the post processing environment. There will also be signal dependent charge injection from the transfer switch 18. However this source of noise can be considered a non-linearity in the system, one of many non-linearities including the pixel amplifier gain deviation and the variation of the photodiode capacitance with voltage.

Persons of ordinary skill in the art will recognize that the CDS circuit disclosed in FIG. 4 herein is merely exemplary and that other CDS circuits may be employed in the present invention. For example, the CDS circuit disclosed in co-pending application Ser. No. 08/867,472, filed Jun. 2, 1997, may also be used as can other equivalent CDS circuits.

Embodiments of the present invention which do not employ correlated double sampling are also contemplated herein. In such embodiments, rising edge 44 of transfer-switch trace 32 of FIG. 3b is not needed and transfer-switch trace 32 stays low until the all of the rows have been read out or another cycle is initiated.

Figure 5:
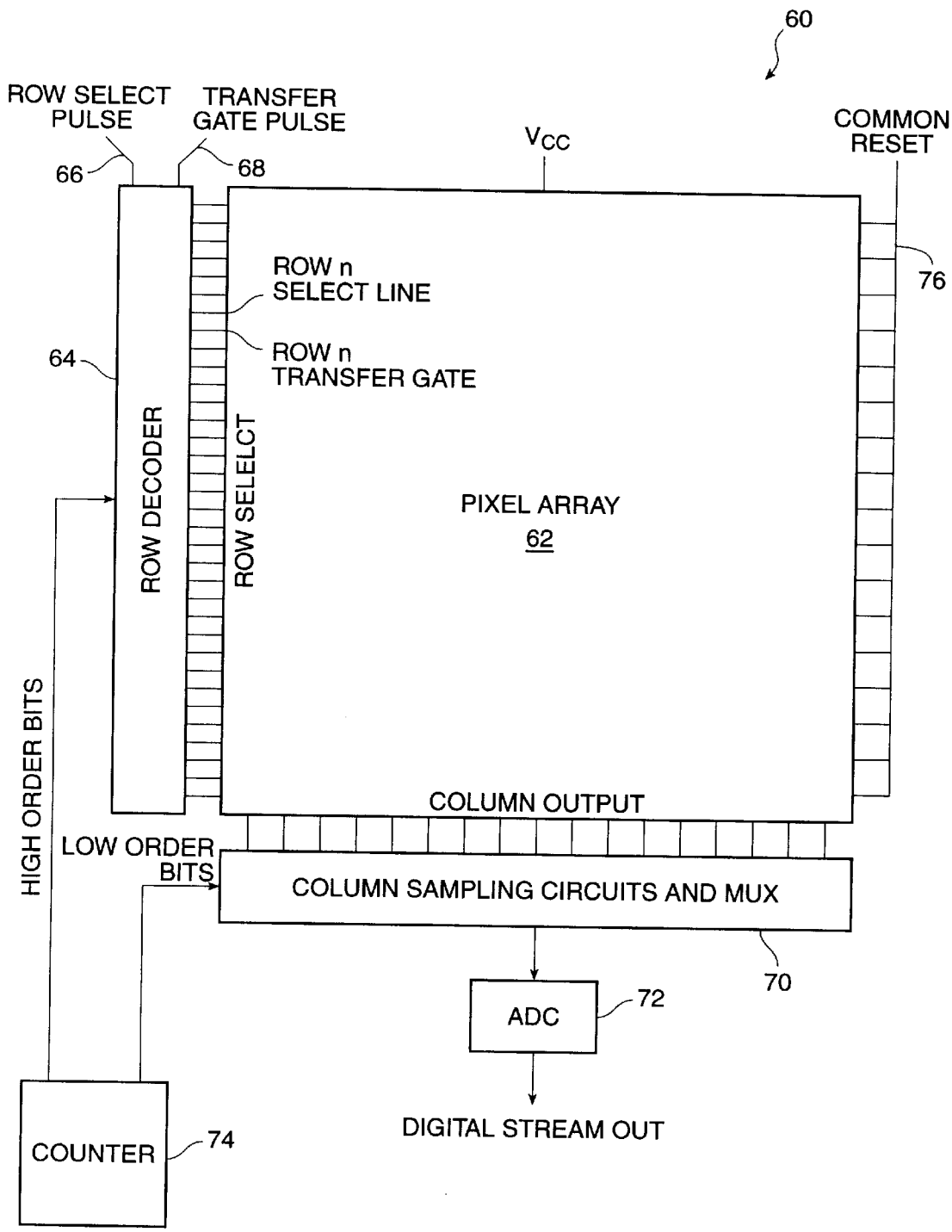
FIG. 5 is a block diagram of an image array making use of the storage technique of the present invention.

Referring now to FIG. 5, a block diagram of an active-pixel imaging array 60 employing the storage technique of the present invention is shown. Like the image array of FIG. 1, image array 60 may comprise an m row by n column array 62 of active-pixel elements. Unlike the array of FIG. 1, each storage-pixel sensor element of the array of FIG. 5 is an element like that of FIG. 3a.

A row decoder circuit 64 is used to select rows of the array. Row decoder circuits, such as row address decoder circuits are well known in the art. Row-select pulse 66 and transfer gate pulse 68 are ANDed with the decoded row address signal in row decoder 64 to produce the timing signals shown in FIG. 3b for each row.

Row decoder circuit 64, along with column sampling circuits and multiplexer 70 are used to extract the pixel information from the array and present it to ADC circuit 72 for digitizing. The column sampling circuits used in array 60 may comprise a decoder similar to the row decoder circuit 64 and column sampling circuit 70 may be driven from a counter 74. Techniques for using counters to drive row and column decoding circuitry are known in the art. Typically, the higher-order bits from counter 74 are used to drive the row decoder circuit 64 and the lower-order bits are used to drive column sampling circuit and multiplexer 70 to permit extraction of all pixel information in a row of the array prior to selection of the next row by row decoder circuit 64.

Because the storage technique of the present invention affords a substantial increase in the time available to read individual pixel values out of the array, use of a single ADC circuit 72 is made possible in active-pixel imaging array 60. As will be appreciated by persons of ordinary skill in the art, a higher-resolution ADC circuit 72 (e.g., 12 bits) may be employed in the imager of the present invention at lower power than ADC circuits that are operating near their performance limit in prior-art imagers.

The length of time available for the readout process is limited by leakage onto the node of the transfer switch that is connected to the storage capacitor 16 of FIG. 3a. This leakage can be either dark (generation/diffusion) current or photo current. Measured dark current for a sub half micron process is about 100 electrons/sec/um$^2$ at room temperature. Since the diffusion area for the transistor devices in the pixels can be made as small as 1 um$^2$, this implies 100 electrons/sec leakage current, which amounts to a 0.2 mV error in the stored signal over 1 second in an embodiment where storage capacitor 16 has a value of 80 fF (5 fF/um$^2$× 16 um$^2$). This represents a small source of error yet extends the read time for the array by a factor of 100 compared to prior art arrays.

If the storage pixel is used in conjunction with a mechanical shutter, the read time limited by dark current can be extended proportional to the ratio of the photodiode area to the transfer switch diffusion area (about 20:1) relative to a simple non-storage pixel used with a mechanical shutter.

The dominant source of error in the storage pixel of the array of the present invention is collection of stray photocurrent in the form of minority carriers. According to another aspect of the present invention, the structure of the storage-pixel sensor of the present invention is chosen to minimize stray photocurrent leakage. FIGS. 6, 7a and 7b, 8, and 9a and 9b, to which attention is now drawn, show cross sections and layout details associated with NMOS and PMOS implementations of the schematic of FIG. 3a that primarily address the stray photocurrent leakage issue.

Figure 6:
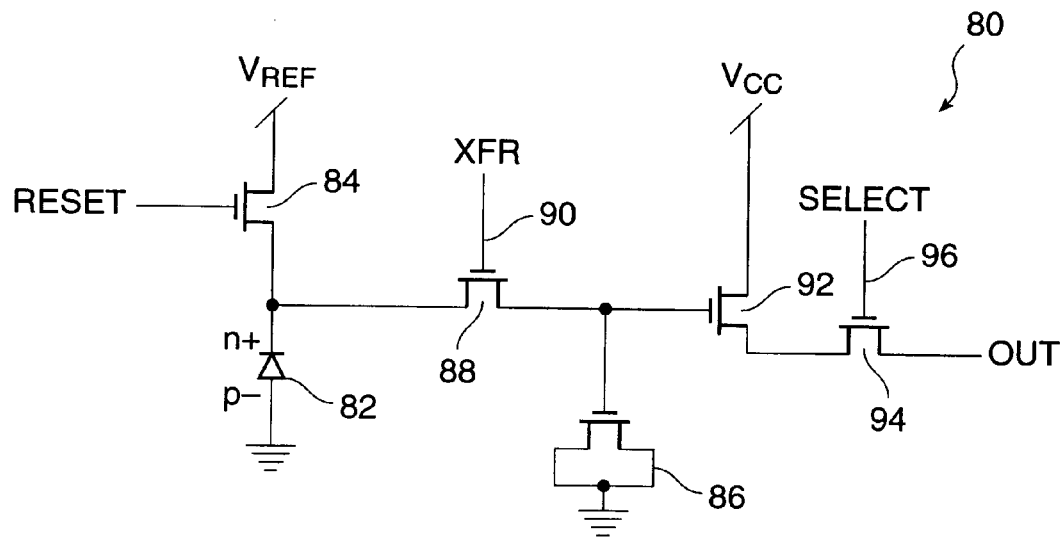

Referring now to FIG. 6, a schematic diagram of an NMOS embodiment of the storage-pixel sensor is shown. All transistors are NMOS, and the photodiode is n+/p−. Although an n+/p-well photodiode is shown, the method would also work with a p+/n-well photodiode.

NMOS storage-pixel sensor 80 employs photodiode 82 having its anode grounded and its cathode connected to the source of N-Channel MOS reset transistor 84. The drain of N-Channel MOS reset transistor 84 is connected to Vref and its gate is connected to the reset line (reference numeral 76 of FIG. 5) which is common to all pixels in the array. The reset line is driven to a voltage at least a threshold above Vref to ensure that the pixels are reset fully to the potential Vref.

In the embodiment of FIG. 6, storage capacitor 16 of FIG. 3a is implemented as an N-Channel MOS storage capacitor transistor 86 with its source and drain tied to ground. N-Channel MOS storage capacitor transistor 86 is coupled to the cathode output of photodiode 82 through N-Channel MOS transfer transistor 88. The gate of N-Channel MOS transfer transistor 88 is connected to transfer line 90.

The voltage on the gate of N-Channel MOS storage capacitor transistor 86 is sensed by N-Channel MOS output transistor 92. N-Channel MOS output transistor 92 operates in source-follower mode, having its drain connected to Vcc and its source connected to N-Channel MOS select transistor 94. According to a presently-contemplated embodiment of the storage-pixel sensor 80 of the present invention, the voltage potential Vcc=Vref. The gate of N-Channel MOS select transistor 94 is driven by select line 96.

Transfer line 90 and select line 96 are driven from a transfer gate pulse on transfer gate line 68 and a row-select pulse on row-select line 66, respectively, of FIG. 5. Both of these signals are gated by a row address decode signal from row decoder 64 of FIG. 5 to assure that only the pixels in a selected row are affected. The transfer gate pulse can also be ON to all rows simultaneously during reset.

N-Channel MOS storage capacitor transistor 86 will have the full gate oxide capacitance to the inversion layer under its gate as long as the voltage on the storage node is >VTN (about 0.6V). The pixel output will not be linear unless the voltage on the storage node is >VTN otherwise the source follower output transistor will be not turned on. Note that the bottom plate of the capacitor is tied to substrate (0 volts) through a butted p+/n+ contact, to eliminate the need for a separate ground wire in the array.

Figure 7A:
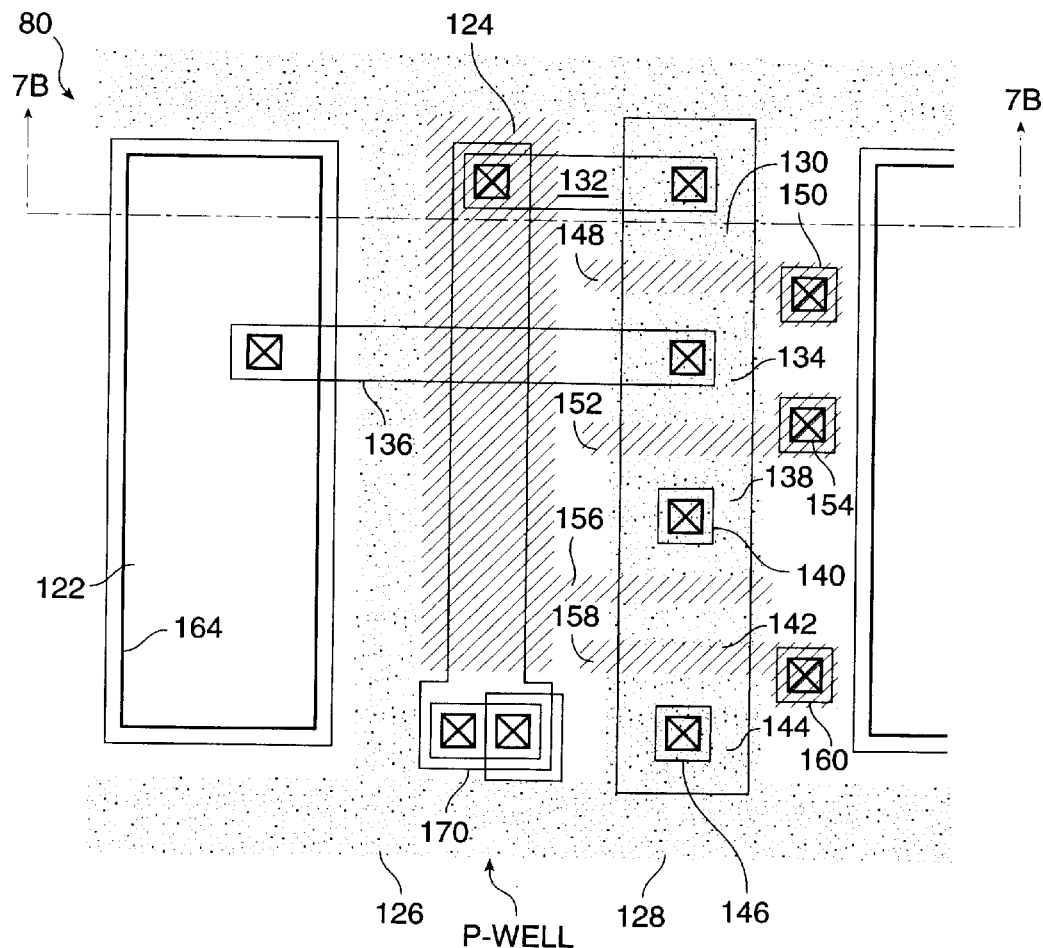
FIGS. 7a and 7b are layout and cross sectional views, respectively, of the NMOS-switch implementation of the storage-pixel sensor circuit of FIG. 6.
Figure 7B:
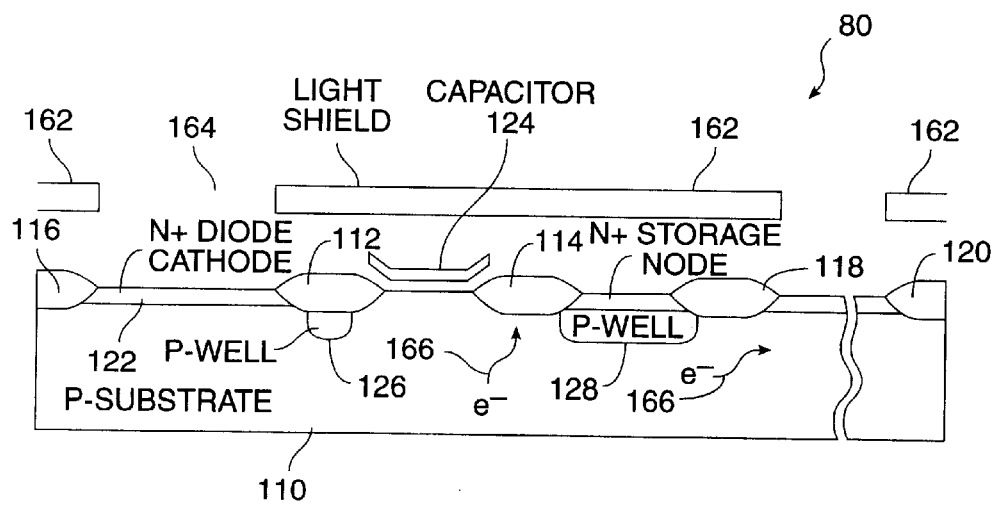

Referring now to FIGS. 7a and 7b, top and cross-sectional views, respectively, of a presently preferred layout of the NMOS storage-pixel sensor 80 of FIG. 6, an important aspect of the invention will be illustrated. The cross section of FIG. 7b is taken through the arrow marked 7b–7b in FIG. 7a.

NMOS storage-pixel sensor 80 is fabricated on a p-type substrate 110. Field oxide regions 112 and 114 separate the active regions of the pixel from one another and field oxide regions 116 and 118 separate the storage-pixel sensor 80 from adjacent storage pixel sensors. Field oxide region 120 belongs to the nearest neighbor storage pixel sensor to the right of storage-pixel sensor 80.

Photodiode 82 of NMOS storage-pixel sensor 80 of FIG. 6 has n+ region 122 as its cathode and the p-substrate 110 as its anode. Storage capacitor 86 of FIG. 6 has polysilicon strip 124 as its upper plate and the p-substrate 110 as its lower plate. P-well 126 isolates the photodiode from the storage capacitor by making an electron-repelling barrier between the regions.

N-Channel MOS transistors 84, 88, 92, and 94 are all formed in p-well 128 and are all easily seen in FIG. 7a, in which n+ region 130 is connected to polysilicon strip 124 of the storage capacitor via metal line 132 and forms drain of N-Channel MOS transfer transistor 88 of FIG. 6. N+ region 134 is connected to N+ cathode region 122 of the photodiode via metal line 136 and forms the source of both N-Channel MOS transistors 84 and 88 of FIG. 6. N+ region 138 is connected to Vcc metal line 140 and forms the drains of both N-Channel MOS reset transistor 84 and N-Channel MOS source-follower transistor 92 of FIG. 6. Persons of ordinary skill in the art will recognize that, in order to avoid overcomplicating the drawing figure and thus unnecessarily obscuring details of the invention, only a small portion of metal line 140 is shown as a square region surrounding the contact depicted in its center. Such skilled persons will appreciate that interconnections are made as disclosed herein in layers such as metal 2 or metal 3 layers of the integrated circuit containing this structure. Other metal lines are similarly depicted.

N+ region 142 forms the source of N-Channel MOS source-follower transistor 92 and the drain of N-Channel MOS select transistor 94. N+ region 144 forms the source of N-Channel MOS select transistor 94 and is connected to metal line 146 forming the column output line for the column of the array containing NMOS storage pixel sensor 80.

Polysilicon strip 148 comprises the gate of N-Channel MOS transfer transistor 88 and is connected to transfer metal line 150 common to all pixels in the row of the array containing pixel 80. Polysilicon strip 152 comprises the gate of N-Channel MOS reset transistor 84 and is connected to reset metal line 154, common to all pixels in the array. Polysilicon strip 156 extending from the polysilicon strip 124 forming the top plate of the storage capacitor comprises the gate of N-Channel MOS source-follower transistor 92. Polysilicon strip 158 comprises the gate of N-Channel MOS select transistor 96 and is connected to select metal line 160, common to all pixels in the column of the array containing the pixel 80.

Metal region 162 (shown in FIG. 7b) is disposed over the structure of the storage pixel 80 and serves as a light shield to prevent photocurrent generation in all regions of storage pixel 80 except the photodiode disposed under aperture 164 formed therein.

An important feature of the layout of NMOS storage-pixel sensor 80 is shown in the figures. In a typical CMOS process the p-well mask is generated as a reverse field of the n-well mask. However since the p-well and n-well implants are masked separately for sub 0.5 um processes, there is no reason why the p-well and n-well must be complementary layers. According to this aspect of the present invention this fact is used advantageously. As shown in FIGS. 7a and 7b, the p-well 128 is placed under all of the N-Channel MOS transistors, and the p-well 126 is placed between the capacitor bottom plate and the photodiode (in this latter case for isolation). Elsewhere there is no p-well or n-well either, only the doping level from the starting wafer (about 1E15 p-type). Furthermore the metal line 162 comprising the light shield extends out over the edges of the p-well 128. This means that photocurrent will only be generated outside the p-well 128 in the bulk.

Since the p-well 128 is doped 100 times more heavily than the p-substrate (10E17 vs. 10E15), there is a potential barrier for electrons to enter the p-well from the bulk of about 100 mV as shown diagrammatically at reference numerals 166. This will suppress collection of electron current by n+ diffusions inside the p-well by about 100 times (using the diode rule of thumb 62 mV/decade of current). Photocurrent generated outside the p-well will be preferentially collected by the n+ region 168 of the photodiode of the adjacent pixel (biased to 5V during the readout interval) or the adjacent capacitor bottom plate shown at reference numeral 170 (at zero volts but still a potential well for electrons).

It should perhaps also be noted that the n+ diffusion 130 connected to the upper plate of the storage capacitor is adjacent within the p-well to the photodiode node on one side (n+ region 134), and the output node (n+ region 144 of the adjacent pixel) on the other side. Both of these diffusions will be biased positively and therefore will collect electron current within the p-well that would otherwise end up on the storage node 130. It is again emphasized that the light shield covers the entire p-well which minimizes photo generated minority carriers within the p-well.

Figure 8:
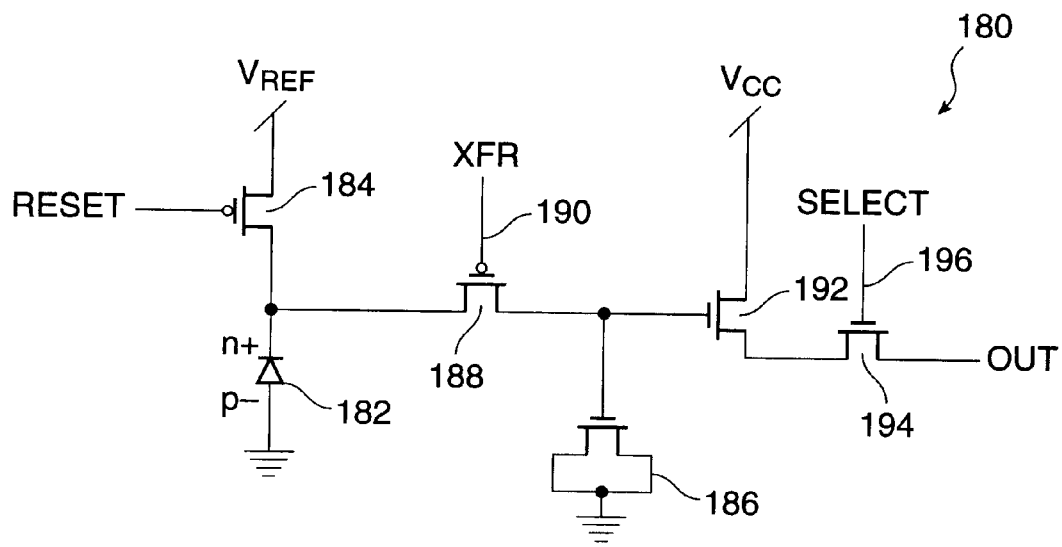

Referring now to FIG. 8, a schematic diagram of an alternate embodiment of a storage pixel sensor 180 according to the present invention is shown utilizing P-Channel reset and transfer transistors. Storage pixel sensor 180 employs photodiode 182 having its anode grounded and its cathode connected to the drain of P-Channel MOS reset transistor 184. The source of P-Channel MOS reset transistor 184 is connected to Vcc and its gate is connected to the reset line (reference numeral 76 of FIG. 5) which is common to all storage pixel sensors in the array.

As in the embodiment of FIG. 6, storage capacitor 16 of FIG. 3a is implemented in the storage pixel sensor of FIG. 8 as an N-Channel MOS storage capacitor transistor 186 with its source and drain tied to ground. N-Channel MOS storage capacitor transistor 186 is coupled to the cathode output of photodiode 182 through P-Channel MOS transfer transistor 188. The gate of P-Channel MOS transfer transistor 188 is connected to transfer line 190.

The voltage on the gate of N-Channel MOS storage capacitor transistor 186 is sensed by N-Channel MOS output transistor 192. N-Channel MOS output transistor 192 operates in source-follower mode, having its drain connected to Vcc and its source connected to N-Channel MOS select transistor 194. According to a presently-contemplated embodiment of the storage pixel sensor 180 of the present invention, the voltage potential Vcc=Vref. The gate of N-Channel MOS select transistor 194 is driven by select line 196.

As in the embodiment of FIG. 6, the transfer line 190 and select line 196 of storage pixel 180 of FIG. 8 are driven from a transfer gate pulse on transfer gate line 68 and a row-select pulse on row-select line 66, respectively, of FIG. 5. Both of these signals are gated by a row address decode signal from row decoder 64 of FIG. 5 to assure that only the pixels in a selected row are affected.

The P-Channel MOS reset transistor 184 is used to reset the photodiode all the way to the positive rail, which would not be possible using the N-Channel MOS reset transistor 84 of the embodiment of FIG. 6. The photodiode 182 still comprises an n+/p junction since that type of photodiode is known to have lower leakage than p+/n−. The source follower output transistor 192 of the embodiment of FIG. 8 remains an N-Channel device since a P-Channel MOS source follower transistor would not be active with its gate near the positive supply rail.

The select transistor 194 is also an N-Channel device since the signal to be passed out of the pixel is always less than Vcc−Vt. The storage capacitor 186 is formed as an N-Channel transistor for the same reasons and in the same way as described for the pixel 80 of FIG. 6.

One issue of concern with respect to the P-Channel MOS transistors of the embodiment of FIG. 8 is subthreshold current. In the embodiment of FIG. 6 employing only N-Channel devices, the useful voltage swing on the circuit node comprising the upper polysilicon plate of storage capacitor 86 is Vref to VTN wherein the leakage is dominated by the junctions and is about 0.02 fA/um$^2$ of junction area. In the embodiment of FIG. 8, the leakage is dominated by P-Channel subthreshold current, and is about 10 pA/um of device width if Vcc=Vref. This value is reduced by a factor of 10 for every 80 mv that the reset high logic level (typically Vcc) exceeds Vref. Vref should be decreased about 0.50V to reduce the order of junction leakage. Reducing the reference voltage in the array does, however, reduce the increase in pixel output swing.

Figure 9A:
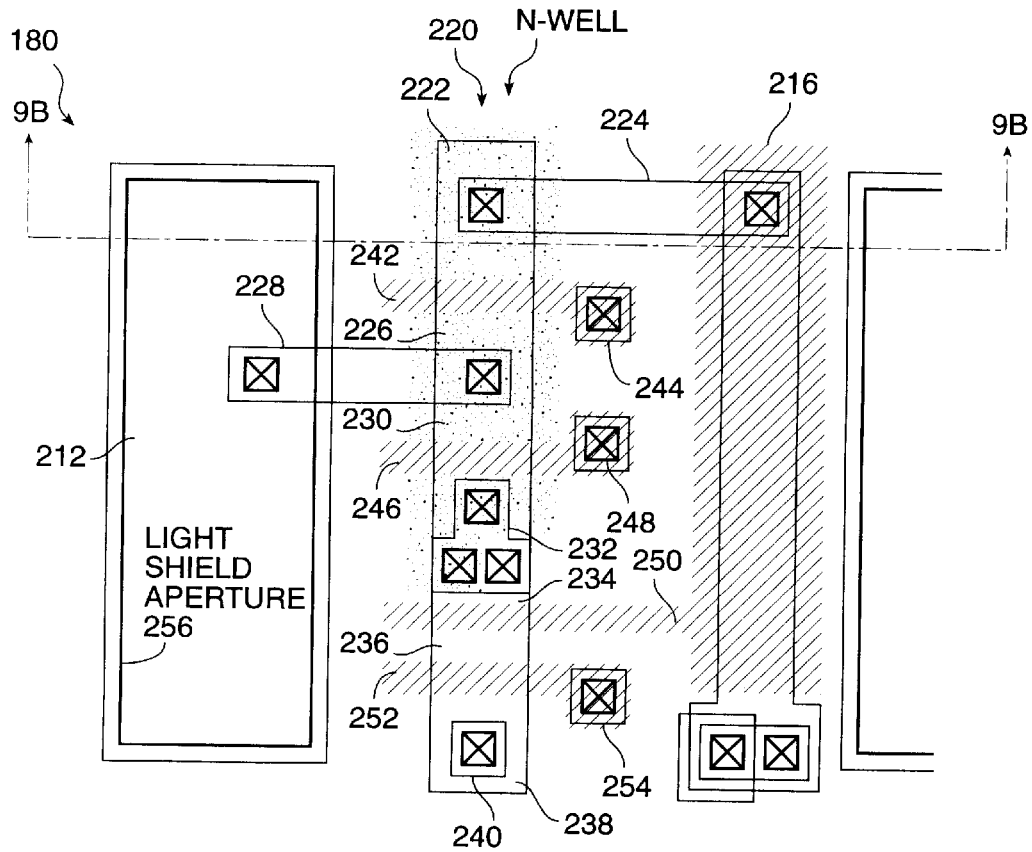
FIGS. 9a and 9b are layout and cross sectional views, respectively, of the PMOS switch implementation of the storage-pixel sensor circuit of FIG. 8.
Figure 9B:
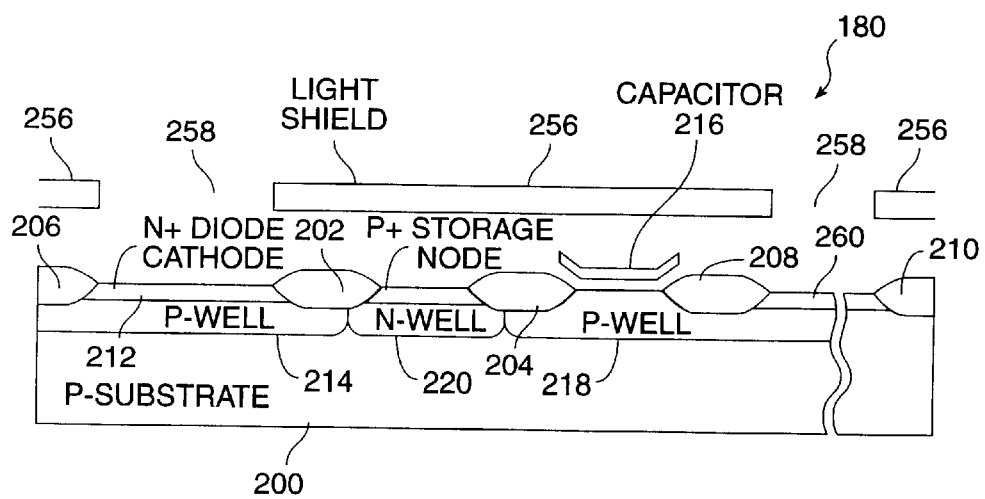

Referring now to FIGS. 9a and 9b, top and cross sectional views of a presently preferred layout of the pixel of FIG. 8 are presented. The cross section of FIG. 9b is taken through the arrow marked 9b—9b in FIG. 9a.

Like the NMOS storage pixel sensor 80 of FIG. 6, storage pixel sensor 180 of FIG. 8 is fabricated on a p-type substrate 200. Field oxide regions 202 and 204 separate the active regions of the pixel from one another and field oxide regions 206 and 208 separate the storage pixel sensor from adjacent storage pixel sensors. Field oxide region 210 belongs to the nearest neighbor storage pixel sensor to the right of pixel 180. A topological difference between the layout of pixel 80 as seen in FIGS. 7a and 7b and the layout of storage pixel sensor 180 of FIGS. 9a and 9b is that the storage capacitor in pixel 180 of FIGS. 9a and 9b is disposed at the right-hand side of the storage pixel sensor rather than in the center. This is a design detail which is not crucial to the invention.

Photodiode 182 of NMOS storage pixel sensor 180 of FIG. 8 has n+ region 212 as its cathode and p-well region 214 as its anode. Storage capacitor 186 of FIG. 8 has polysilicon strip 216 as its upper plate and p-well region 218 as its lower plate. Those of ordinary skill in the art will appreciate that p-well regions 214 and 218 can be part of the same p-well.

P-Channel MOS transistors 184 and 188 are formed in n-well 220 and are easily seen in FIG. 9a, in which p+ region 222 is connected to polysilicon strip 216 of the storage capacitor via metal line 224 and forms the source of P-Channel MOS transfer transistor 188 of FIG. 8. P+ region 226 is connected to n+ cathode region 212 of the photodiode via metal line 228 and forms both the drain of P-Channel MOS transfer transistor 188 and the drain of P-Channel MOS reset transistor 184 of FIG. 8. P+ region 230 is connected to Vcc metal line 232 and forms the source of P-Channel MOS reset transistor 184. Metal line 232 also bridges the border of n-well 220 to connect p+ region 230 in the n-well 220 to n+ region 234 which forms the drain of N-Channel MOS source-follower transistor 192 of FIG. 8. N+ region 236 forms the source of N-Channel MOS source-follower transistor 192 and the drain of N-Channel MOS select transistor 194. N+ region 238 forms the source of N-Channel MOS select transistor 194 and is connected to metal line 240 forming the column output line for the column of the array containing storage pixel 180.

Polysilicon strip 242 comprises the gate of P-Channel MOS transfer transistor 188 and is connected to transfer metal line 244, common to all storage pixel sensors in the row containing storage pixel sensor 180. Polysilicon strip 246 comprises the gate of P-Channel MOS reset transistor 184 and is connected to reset metal line 248, common to all storage pixel sensors in the array. Polysilicon strip 250 extending from the polysilicon strip 216 forming the top plate of the storage capacitor comprises the gate of N-Channel MOS source-follower transistor 192. Polysilicon strip 252 comprises the gate of N-Channel MOS select transistor 196 and is connected to select metal line 254, common to all storage pixel sensors in the column containing storage pixel sensor 180.

Metal line 256 is disposed over the n-well 220 and over the n+ diffusions for transistors 192 and 194 and serves as a light shield to minimize the concentration of photo generated minority carriers (holes) within the well which could contribute to leakage of the storage node. Apertures 258 allow light to enter in the region of the photodiode of storage pixel 180 indicated at n+region 212 and n+region 260 of the photodiode of the adjacent storage pixel. The pixel 180 of FIGS. 8, 9a, and 9b is 50% larger than pixel 80 of FIGS. 6, 7a, and 7b, however it should provide a longer readout duration than the pixel 80 and a larger output voltage swing as well.

The storage pixels of the present invention differ in several respects from prior-art pixels which provide for storage. The present invention uses a different circuit with fewer transistors and control lines, and uses a different timing scheme, which allows a higher dynamic range of charge integration, and allows for relatively longer frame storage times as needed in high resolution still photography, all these features being enabled by the improved leakage and contamination performance.

Figure 10B:
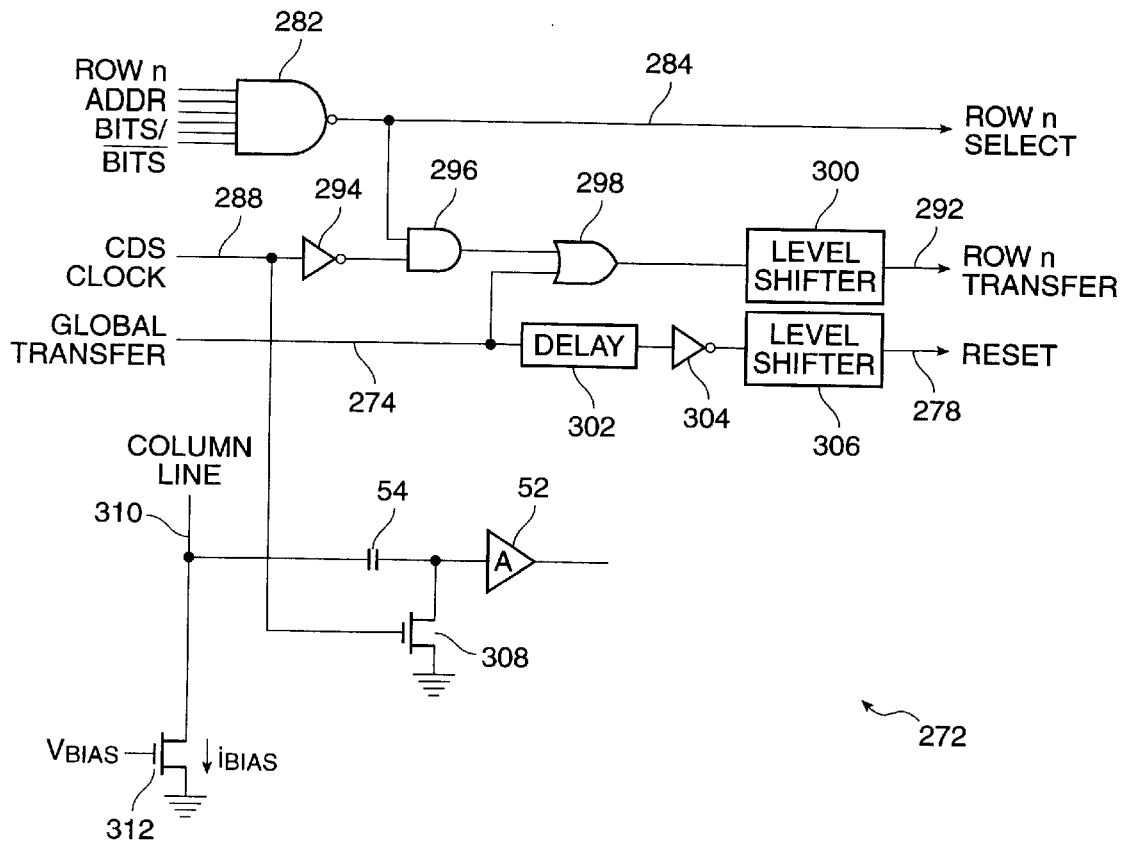

Referring now to FIGS. 10a and 10b, respectively, more detailed diagrams are presented of control signals and circuitry for operating an array of storage-pixel sensor arrays according to the present invention. FIGS. 10a and 10b illustrate the operation of the reset, transfer, and select signals used to operate an array as presently preferred according to the present invention. Persons of ordinary skill in the art will appreciate that control circuitry 272 depicted in FIG. 10b is illustrative only and that other configurations may be employed to generate the waveforms shown in FIG. 10a.

Referring now to both FIGS. 10a and 10b, several control signal waveform traces are presented. The first waveform of FIG. 10a represents Global Transfer control signal 270. This control signal is shown at the left side of the control circuitry 272 depicted in FIG. 10b as appearing on line 274. Control circuitry 272 may be disposed in or associated with Row decoder 64 of FIG. 2.

The second waveform of FIG. 10a represents Reset control signal 276. This control signal is generated by the control circuitry of FIG. 10b and appears on line 278.

The third waveform of FIG. 10a represents Row N Select control signal 280. The Row N Select control signal is derived from decoder gate 282 in control circuitry 272 using the appropriate Row N address bits and their complements as is well known in the art. The Row N Select control signal appears on line 284.

The fourth waveform of FIG. 10a is the CDS Clock signal 286. CDS Clock signal 286 is shown on only a portion of the horizontal direction representing the time axis in FIG. 10a in order to avoid unnecessarily complicating the drawing figure. CDS Clock signal 286 is shown at the left side of the control circuitry 272 depicted in FIG. 10b as appearing on line 288.

The last waveform of FIG. 10a is the Row N Transfer control signal 290. Row N Transfer control signal 290 is an output of the control circuitry 272 appearing on line 292 of FIG. 10b.

Turning to FIG. 10b in more detail, the Row N Select signal on line 284 is combined with the CDS Clock signal on line 288 and the Global Transfer signal on line 274 through inverter 294, AND gate 296, OR gate 298, and level-shifter circuit 300 to produce Row N Transfer signal 290 on line 292. Global Transfer signal on line 274 is presented to delay circuit 302, inverter 304, and level-shifter circuit 306 to produce Reset signal on line 278.

Level-shifter circuits 300 and 306 are used to provide sufficient high and low voltage levels for the Row N Transfer signal 290 and Reset signal 276 to assure full reset, low leakage, overflow drainage, etc., and to generally optimize the operation of the array. This is explained diagrammatically in FIG. 11.

The CDS Clock signal on line 288 is also presented to the CDS circuit illustrated in the lower left hand portion of FIG. 10b. The CDS circuit is shown configured in and operates as described with reference to FIG. 4. Thus CDS Clock signal on line 288 turns on N-Channel MOS transistor 308 which functions as switch 56 in FIG. 4. Capacitor 54 is also shown in FIG. 4 as driving amplifier 52 from column line 310. N-Channel bias transistor 312, its gate connected to bias voltage Vbias, maintains a bias current flow of magnitude i as shown. Typical values for the bias voltage and current are about 1 volt and about 5 $\mu$A.

In embodiments of the present invention that do not employ correlated double sampling, inverter 294, AND gate 296, and OR gate 298 are not used, and the global transfer signal on line 274 is connected directly to the input of a single level shifter circuit to drive all transfer switches in the array.

Figure 11:
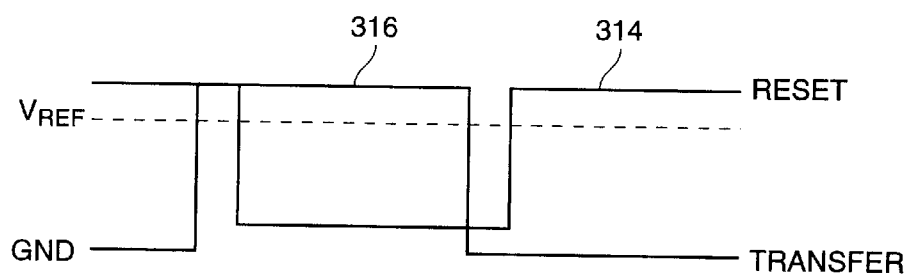
FIG. 11 is a magnified portion of portions of waveforms like those appearing in FIG. 10a, showing in more detail the voltage levels provided by level-shifter circuits for the various control signals used by the array of the present invention.

Referring now to FIG. 11, it may be seen that the voltage levels of the signals used to drive the gates of transfer switch 18 and reset switch 22 of FIG. 3a should be sufficient to fully turn on the MOS transistor switch devices such that no Vth drop appears across these devices. In addition, a raised low level value (e.g., about 1.5 volts) on the reset line allows electrons to overflow to Vref during integration to prevent overflow from brightly-lighted pixels into adjacent pixels. Those of ordinary skill in the art will appreciate that the timing of the signals shown in FIG. 11 is arbitrary since the figure is meant to illustrate the voltage levels of the signals used to drive the gates of transfer switch 18 and reset switch 22 of FIG. 3a with reference to ground potential and Vref. The Reset signal (trace 314) is shown having a high level above that of Vref and a low level elevated above ground. The Transfer signal (trace 316) is shown having a high level above that of Vref and a low level at about ground potential.

Figure 12:
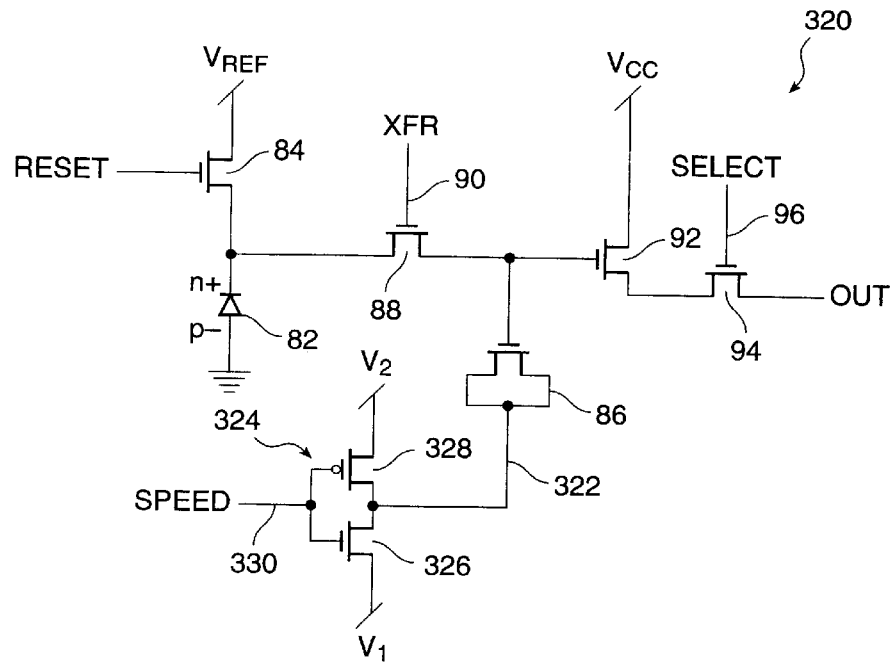
FIG. 12 is a schematic diagram of an NMOS-switch implementation of the storage-pixel sensor circuit of FIG. 6 including a speed switch feature.

Referring now to FIGS. 12 and 13a and 13b, a speed switch (like a film speed or ASA or ISO setting on a conventional film camera) may be integrated into the frame-storage imager array of the present invention depicted in FIGS. 6, 7a–7b, 8, and 9a–9b. FIG. 12 is a schematic diagram of an illustrative embodiment of an NMOS-switch implementation of the storage-pixel sensor circuit of FIG. 6 including a speed switch feature. From FIG. 12, persons of ordinary skill in the art will readily recognize how to implement the speed switch feature of the present invention in the PMOS-switch embodiment of FIG. 8. Features of FIG. 12 which correspond to features in FIG. 6 will be assigned the same reference numerals as in such previous drawing figures. With the exception of the speed switch feature of the present invention, the circuit of FIG. 12 operates in the same manner as the circuit of FIG. 6.

As in the embodiment of FIG. 6, NMOS storage-pixel sensor 320 of FIG. 12 employs photodiode 82 having its anode grounded and its cathode connected to the source of N-Channel MOS reset transistor 84. The drain of N-Channel MOS reset transistor 84 is connected to Vref and its gate is connected to the reset line (reference numeral 76 of FIG. 5) common to all pixels in the array.

In the embodiment of FIG. 12, storage capacitor 16 of FIG. 3a is implemented as an N-Channel MOS storage capacitor transistor 86 with its source/drain terminal and channel region forming a bottom capacitor plate tied to Vspeed node 322. The top plate of N-Channel MOS storage capacitor transistor 86 comprises its gate which is coupled to the cathode output of photodiode 82 through N-Channel MOS transfer transistor 88. The gate of N-Channel MOS transfer transistor 88 is connected to transfer line 90.

As in the embodiment of FIG. 6, the voltage on the gate of N-Channel MOS storage capacitor transistor 86 is sensed by N-Channel MOS output transistor 92. N-Channel MOS output transistor 92 operates in source-follower mode, having its drain connected to Vcc and its source connected to N-Channel MOS select transistor 94. The gate of N-Channel MOS select transistor 94 is driven by select line 96.

Transfer line 90 and select line 96 are driven from a transfer gate pulse on transfer gate line 68 and a row-select pulse on row-select line 66, as disclosed with reference to the circuit of FIG. 6.

The Vspeed node 322 is driven from inverter 324, comprising N-Channel MOS transistor 326 and P-Channel MOS transistor 328. The common gate connection of the inverter transistors is connected to a SPEED control node 330. The source of N-Channel MOS transistor 326 is connected to a voltage source V1 and the source of P-Channel MOS transistor 328 is connected to voltage source V2. V1 is chosen to be near ground, so that when SPEED node 330 and the input of the inverter is high and N-Channel MOS transistor 326 is on, the bottom plate (channel) of N-Channel MOS capacitor 86 will be at about V1 to provide a first control potential, will have an inversion charge under the gate and will exhibit high capacitance. V2 is chosen to be about 3 volts, so that when SPEED node 330 and the input of the inverter is low and P-Channel MOS transistor 328 is on, the bottom plate of N-Channel MOS capacitor will be at about V2 to provide a second control potential, will have only distant charges in the substrate under the gate, and will exhibit low capacitance.

As may be easily seen by an examination of FIG. 12, the speed switch feature of the present invention operates by changing the bias voltage at the bottom plate of the storage capacitor, thereby significantly changing the capacitance and therefore the charge-to-voltage gain.

The capacitance changes by a large factor because the capacitor is a MOS structure with voltage-dependent gate-to-channel capacitance. It has previously been shown in FIG. 6 with grounded source/drain connection to keep it in a state of inversion, where the capacitance is high because of minority carriers (electrons) present immediately under that gate oxide. According to one aspect of the present invention, when the source/drain terminal is switched to around +3 V, the capacitor is operating in depletion, with majority carriers (holes) that make the capacitor work held at a significant depth below the gate oxide, resulting in much lower capacitance. In this mode, any stray minority carriers that drift into the depletion region will be quickly swept up by the biased source/drain region, so will not affect the storage integrity.

Figure 13:
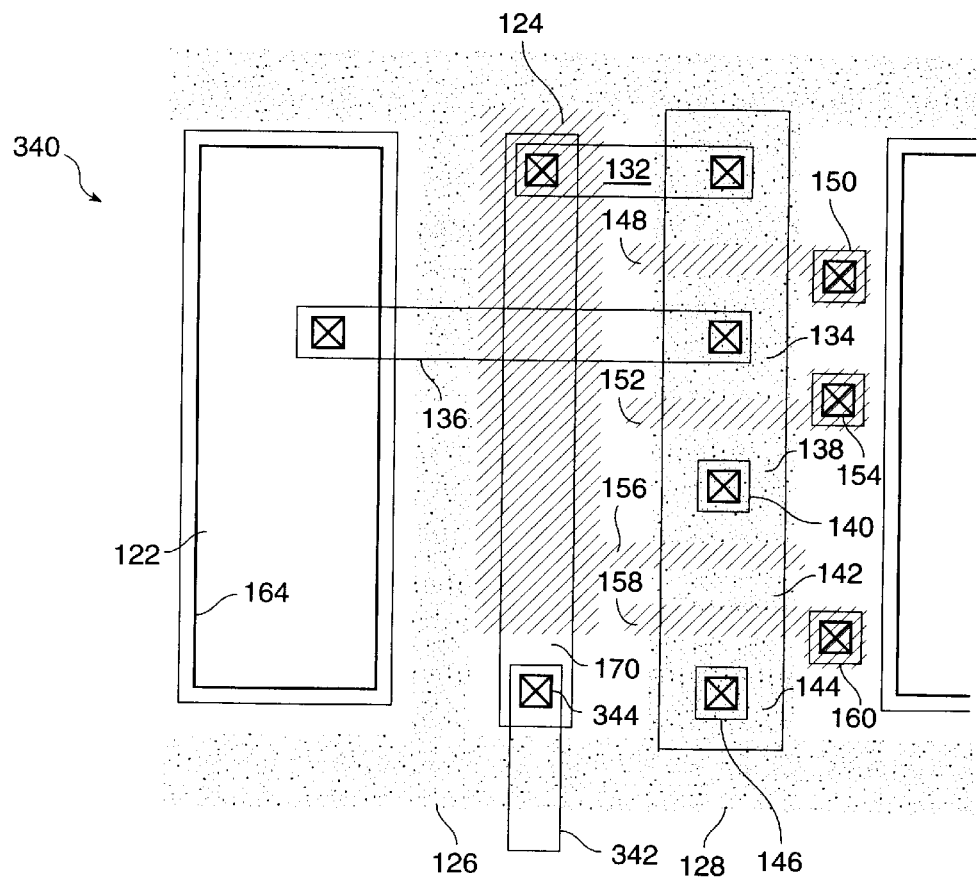
FIG. 13 is layout view of the portion of the NMOS-switch implementation of the storage-pixel sensor circuit of FIG. 12 which best illustrate the speed switch feature of the present invention.

FIG. 13 is a layout view of the NMOS-switch implementation 340 of the storage-pixel sensor circuit of FIG. 12 which illustrate the speed switch feature of the present invention. The cross sectional view of the embodiment of FIG. 13 is the same as in FIG. 7b. Features of FIG. 13 which correspond to features in previous drawing figures herein will be assigned the same reference numerals as in such previous drawing figures. The connectivity of the various circuit elements depicted in FIG. 13 is the same as described for the embodiment of FIGS. 7a with one exception. In FIG. 7a, the diffusion at the bottom plate of the capacitor seen at reference numeral 170 is connected to the substrate through a metal line contacting p+ and n+ diffusions as is known in the art. In contrast the diffusion connection to the bottom plate of the capacitor seen at reference numeral 170 in FIG. 13a is connected to a metal line 342 by contact 344. Metal line 342 forms Vspeed node 322 of FIG. 12, and is preferably common to all of the pixels in the array so that only a single inverter 324 is needed.

The speed switch of the present invention is useful because it allows the user to make a dynamic decision on an important tradeoff between light sensitivity and noise. When the capacitance is high, it takes more light to get a given voltage, but the high capacitance keeps the circuit noise low. When the capacitance is low, it takes less light, but the image is somewhat more susceptible to noise. The sensitive or high-speed mode is particularly useful for making a real-time viewfinder function that must operate at a normal room lighting level or with modeling lights, when the actual exposure is going to done with a strobe in the low-speed mode.

Figure 14:
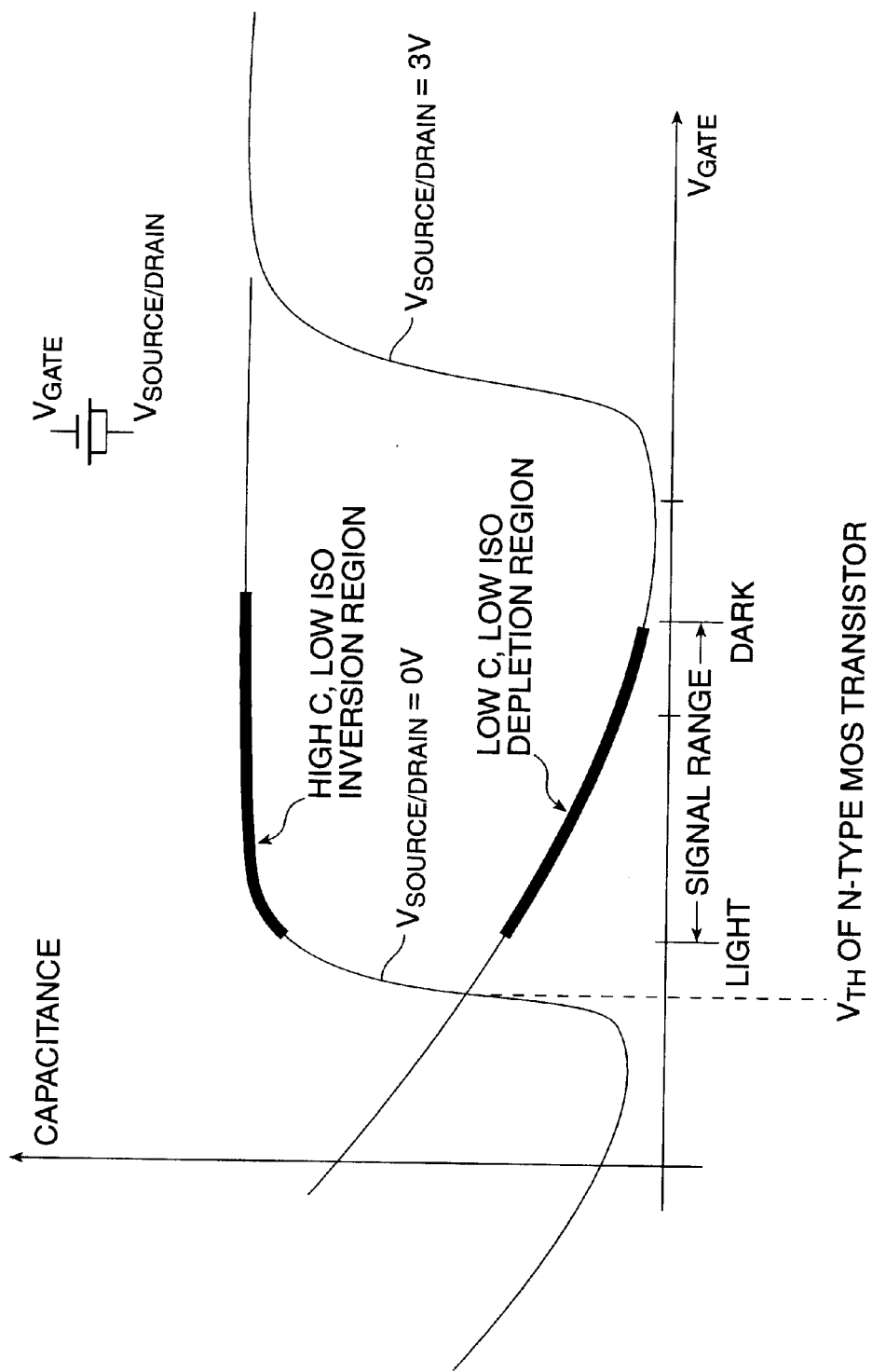
FIG. 14 is a graph illustrating the capacitance of the MOS capacitor as a function of gate voltage.

Typically, the capacitance will be changed from somewhat less than the photodiode capacitance (because making it much smaller would give diminishing returns on speed) to several times more than the photodiode capacitance. FIG. 14 is a graph illustrating the capacitance of the MOS capacitor as a function of gate voltage. The first trace 350 of FIG. 14 shows the effect on capacitance of setting the source/drain diffusion at zero volts. Under these conditions, the device is in inversion, the capacitance is high. The second trace 352 of FIG. 14 shows the effect on capacitance of setting the source/drain diffusion at about 3 volts. Under these conditions, the device is in depletion, and the capacitance is low.

Those of ordinary skill in the art will readily appreciate that the MOS capacitor with switchable depletion/inversion bias settings disclosed herein can be used to switch the charge-to-voltage conversion gain in a variety of different active pixel sensor circuits other than the storage pixel circuits described herein. Such skilled persons will also appreciate that the semiconductor structures described herein could be fabricated on an n-type substrate instead of a p-type substrate by reversing all p and n regions shown in FIGS. 7a, 7b, 9a, 9b, and 13. In addition, such skilled persons will realize that other type changes between p and n devices could be implemented without departing from the teachings of the invention.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A storage pixel sensor disposed on a semiconductor substrate comprising:

a capacitive storage element comprising a MOS capacitor having a diffusion terminal and a gate terminal;

a speed node connected to said diffusion terminal, said speed node biased at either a first control potential or a second control potential, said first control potential selected to keep said MOS capacitor in a state of inversion, and said second control potential selected to keep said MOS capacitor in a state of depletion;

a photodiode having a first terminal and a second terminal, said first terminal connected to a reference potential;

a semiconductor reset switch having a first terminal connected to said second terminal of said photodiode, a second terminal connected to a reset reference potential that reverse biases said photodiode, and a control element connected to a control circuit for selectively activating said semiconductor reset switch;

a semiconductor transfer switch having a first terminal connected to said second terminal of said photodiode, a second terminal connected to said gate terminal of said capacitive storage element, and a control element connected to said control circuit for selectively activating said semiconductor transfer switch;

a semiconductor amplifier having an input and an output, said input connected to said gate terminal of said capacitive storage element;

a light shield disposed over a portion of the semiconductor substrate including said second terminal of said semiconductor transfer switch to prevent substantially all photons from entering said portion of said semiconductor substrate; and minority carrier rejection means for preventing substantially all minority carriers generated in said semiconductor substrate from entering said second terminal of said semiconductor transfer switch.

2. The storage pixel sensor of claim 1, wherein said portion of said semiconductor substrate further includes said gate terminal of said capacitive storage element and said input of said semiconductor amplifier.

3. The storage pixel sensor of claim 1, further including a semiconductor select switch having an input connected to the output of said amplifier, an output connected to an output bus, and a control element connected to said control circuit.

4. The storage pixel sensor of claim 1 wherein:

said semiconductor substrate is formed from a semiconductor material of a first conductivity type;

said light shield is a portion of a metal layer disposed over said semiconductor substrate;

said semiconductor transfer switch comprises a MOS transistor of a second conductivity type opposite said first conductivity type, said MOS transistor formed in a well of said first conductivity type, said well disposed in said semiconductor substrate, wherein said minority carrier rejection means comprises said well.

5. The storage pixel sensor of claim 1 wherein:

said semiconductor substrate is formed from a semiconductor material of a first conductivity type;

said light shield is a portion of a metal layer disposed over said semiconductor substrate;

said semiconductor transfer switch comprises a MOS transistor of said first conductivity type formed in a well of a second conductivity type opposite said first conductivity type, said well disposed in said semiconductor substrate, wherein said minority carrier rejection means comprises said well.

6. The storage pixel sensor of claim 1 wherein:

said semiconductor substrate is p-type semiconductor substrate;

said light shield is a portion of a metal layer disposed over said semiconductor substrate;

said semiconductor transfer switch comprises an N-Channel MOS transistor formed in a p-well formed in said p-type semiconductor substrate, wherein said minority carrier rejection means comprises said p-well.

7. The storage pixel sensor of claim 1 wherein:

said semiconductor substrate is p-type semiconductor substrate;

said light shield is a portion of a metal layer disposed over said semiconductor substrate;

said semiconductor transfer switch each comprise a P-Channel MOS transistor formed in an n-well formed in said p-type semiconductor substrate, wherein said minority carrier rejection means comprises said n-well.

8. An array of storage pixel sensors disposed on a semiconductor substrate, the array comprising:

a plurality of storage pixel sensors, each storage pixel sensor including:

a capacitive storage element comprising a MOS capacitor having a diffusion terminal and a gate terminal;

a speed node connected to said diffusion terminal, said speed node biased at either a first control potential or a second control potential, said first control potential selected to keep said MOS capacitor in a state of inversion, and said second control potential selected to keep said MOS capacitor in a state of depletion;

a photodiode having a first terminal and a second terminal, said first terminal connected to a reference potential;

a semiconductor reset switch having a first terminal connected to said second terminal of said photodiode, a second terminal connected to a reset reference potential that reverse biases said photodiode, and a control element;

a semiconductor transfer switch having a first terminal connected to said second terminal of said photodiode, a second terminal connected to said gate terminal of said capacitive storage element, and a control element;

a semiconductor amplifier having an input and an output, said input connected to said gate terminal of said capacitive storage element;

a light shield disposed over a portion of the semiconductor substrate including said second terminal of said semiconductor transfer switch to prevent substantially all photons from entering said portion of said semiconductor substrate;

minority carrier rejection means for preventing substantially all minority carriers generated in said semiconductor substrate from entering said second terminal of said semiconductor transfer switch; and means for generating a reset signal and for coupling said reset signal to the control element of all reset switches in the array;

means for generating a global transfer signal and for coupling said global transfer signal to the control element of all transfer switches in the array; and a column line for each column in the array, each column line coupled to the outputs of the ones of the semiconductor amplifier associated with that column.

9. The storage pixel sensor of claim 8 further including means for generating a row transfer signal for each row in the array and for coupling the row transfer signal for each row to the control element of all transfer switches associated with that row.

10. The storage pixel sensor of claim 8, wherein said portion of said semiconductor substrate further includes said gate terminal of said capacitive storage element and said input of said semiconductor amplifier.

11. The array of claim 8 wherein each storage pixel sensor further includes a semiconductor select switch having an input connected to the output of said amplifier, an output connected to an output bus, and a control element connected to said control circuit.

12. The array of claim 8 wherein:

said semiconductor substrate is formed from a semiconductor material of a first conductivity type;

said light shield in each storage pixel sensor is a portion of a metal layer disposed over said semiconductor substrate;

said semiconductor transfer switch in each storage pixel sensor comprises a MOS transistor of a second conductivity type opposite said first conductivity type, said MOS transistor formed in a well of said first conductivity type, said well disposed in said semiconductor substrate, wherein said minority carrier rejection means comprises said well.

13. The array of claim 8 wherein:

said semiconductor substrate is formed from a semiconductor material of a first conductivity type;

said light shield in each storage pixel sensor is a portion of a metal layer disposed over said semiconductor substrate;

said semiconductor transfer switch in each storage pixel sensor comprises a MOS transistor of said first conductivity type formed in a well of a second conductivity type opposite said first conductivity type, said well disposed in said semiconductor substrate, wherein said minority carrier rejection means comprises said well.

14. The array of claim 8 wherein:

said semiconductor substrate is p-type semiconductor substrate;

said light shield in each storage pixel sensor is a portion of a metal layer disposed over said semiconductor substrate;

said semiconductor transfer switch in each storage pixel sensor comprises an N-Channel MOS transistor formed in a p-well formed in said p-type semiconductor substrate, wherein said minority carrier rejection means comprises said p-well.

15. The array of claim 8 wherein:

said semiconductor substrate is p-type semiconductor substrate;

said light shield in each storage pixel sensor is a portion of a metal layer disposed over said semiconductor substrate;

said semiconductor transfer switch in each storage pixel sensor comprises a P-Channel MOS transistor formed in an n-well formed in said p-type semiconductor substrate, wherein said minority carrier rejection means comprises said n-well.

16. A method for operating a storage pixel sensor of claim 1 including the steps of:

(1) biasing the speed node at either the first control potential or the second control potential;

(2) turning on the transfer switch of the storage pixel sensor for a first time period and turning off said transfer switch at the end of said first time period;

(3) turning on the reset switch of the storage pixel sensor for a reset period occurring during a first portion of said first time period and turning off said reset switch at the end of said first portion of said first time period;

(4) integrating photocurrent in the storage pixel sensor for an integration period occurring during a second portion of said first time period after said reset switch has been turned off, said integration period ending at the end of said first time period;

(5) turning on the reset switch of the storage pixel sensor after the end of said first time period; and (6) reading an output signal from the amplifier of the storage pixel sensor.

17. A method for operating the storage pixel sensor of claim 1, including the steps of:

(1) biasing the speed node at either the first control potential or the second control potential;

(2) turning on the transfer switch of the storage pixel sensor for a first time period and turning off said transfer switch at the end of said first time period;

(3) turning on the reset switch of the storage pixel sensor for a reset period occurring during a first portion of said first time period and turning off said reset switch at the end of said first portion of said first time period;

(4) integrating photocurrent in the storage pixel sensor for an integration period occurring during a second portion of said first time period after said reset switch has been turned off, said integration period ending at the end of said first time period;

(5) turning on the reset switch of the storage pixel sensor for a reference period after the end of said first time period; and (6) reading an output signal from the storage pixel sensor, then activating the transfer switch of the storage pixel sensor and reading a reference signal from the storage pixel sensor, then taking the difference between the output signal and the reference signal for the storage pixel sensor.

18. A method for operating an array of storage pixel sensors of claim 8 arranged in rows, including the steps of:

(1) biasing the speed node of all storage pixel sensors in the array at either the first control potential or the second control potential;

(2) turning on the transfer switches of all storage pixel sensors in the array for a first time period and turning off said transfer switches at the end of said first time period;

(3) turning on the reset switches of all storage pixel sensors in the array for a reset period occurring during a first portion of said first time period and turning off said reset switches at the end of said first portion of said first time period;

(4) integrating photocurrent in all storage pixel sensors in the array for an integration period occurring during a second portion of said first time period after said reset switches have been turned off, said integration period ending at the end of said first time period;

(5) turning on the reset switches of all storage pixel sensors in the array for a reference period after the end of said first time period;

(6) selecting a row of the array and reading an output signal from each storage pixel sensor in the selected row; and (7) repeating step (6) until output signals for all storage pixel sensors in all rows of the array have been read.

19. A pixel sensor disposed on a semiconductor substrate comprising:

a capacitive element on which photo-generated charge accumulates, said capacitive element having a first terminal on which forms a voltage representative of the amount of light detected, and a second terminal;

a speed control voltage source connected to said second terminal of said capacitive element;

a semiconductor amplifier having an input terminal connected to the first terminal of said capacitive element;

said capacitive element being substantially nonlinear such that the value of the speed control voltage source substantially changes the effective charge-to-voltage conversion gain of the pixel sensor.

20. The pixel sensor of claim 19 wherein:

said capacitive element is a MOS capacitor, said first terminal of said capacitive element comprises a gate terminal of the MOS capacitor, and said second terminal of said capacitive element comprises the diffusion source/drain terminal of the MOS capacitor; and said speed control voltage source configured to provide first and second control voltages that keep the MOS capacitor operating in inversion and depletion modes respectively.

21. A storage pixel sensor disposed on a semiconductor substrate comprising:

a capacitive storage element comprising a MOS capacitor having a diffusion terminal and a gate terminal capacitor;

a speed node connected to said diffusion terminal, said speed node biased at either a first control potential or a second control potential, said first control potential selected to keep said MOS capacitor in a state of inversion, and said second potential selected to keep said MOS capacitor in a state of depletion;

a photodiode having a first terminal and a second terminal, said first terminal connected to a reference potential;

a semiconductor reset switch having a first terminal connected to said second terminal of said photodiode, a second terminal connected to a reset reference potential that reverse biases said photodiode, and a control element connected to a control circuit for selectively activating said semiconductor reset switch; and a semiconductor amplifier having an input and an output, said input connected to said gate terminal of said capacitive storage element.

22. The storage pixel sensor of claim 21, further including a semiconductor select switch having an input connected to the output of said amplifier, an output connected to an output bus, and a control element connected to said control circuit.

23. A method for operating a storage pixel sensor of claim 21 including the steps of:

(1) biasing the speed node at either the first control potential or the second control potential;

(2) turning on the reset switch of the storage pixel sensor for a reset period occurring during a first portion of a first time period and turning off said reset switch at the end of said first portion of said first time period;

(3) integrating photocurrent in the storage pixel sensor for an integration period occurring during a second portion of said first time period after said reset switch has been turned off, said integration period ending at the end of said first time period;

(4) turning on the reset switch of the storage pixel sensor after the end of said first time period; and (5) reading an output signal from the amplifier of the storage pixel sensor.

24. An array of storage pixel sensors disposed on a semiconductor substrate, the array comprising:

a plurality of storage pixel sensors, each storage pixel sensor including:

a capacitive storage element comprising a MOS capacitor having a diffusion terminal and a gate terminal;

a speed node connected to said diffusion terminal, said speed node biased at either a first control potential or a second control potential, said first control potential selected to keep said MOS capacitor in a state of inversion, and said second control potential selected to keep said MOS capacitor in a state of depletion;

a photodiode having a first terminal connected to a first potential and a second terminal;

a semiconductor reset switch having a first terminal connected to said second terminal of said photodiode, a second terminal connected to a reset potential that reverse biases said photodiode and a control element;

a semiconductor amplifier having an input connected to said gate terminal of said capacitive storage element and an output;

means for generating a reset signal and for coupling said reset signal to the control elements of all reset switches in the array; and a column line for each column in the array, each column line coupled to the outputs of the ones of the semiconductor amplifier associated with that column.

25. The array of claim 24 wherein each storage pixel sensor further includes a semiconductor select switch having an input connected to the output of said amplifier, an output connected to an output bus, and a control element connected to said control circuit.

26. A method for operating an array of storage pixel sensors of claim 23 arranged in rows, including the steps of:

(1) biasing the speed node of all storage pixel sensors in the array at either the first control potential or the second control potential;

(2) turning on the reset switches of all storage pixel sensors in the array for a reset period occurring during a first portion of a first time period and turning off said reset switches at the end of said first portion of said first time period;

(3) integrating photocurrent in all storage pixel sensors in the array for an integration period occurring during a second portion of said first time period after said reset switches have been turned off, said integration period ending at the end of said first time period;

(4) turning on the reset switches of all storage pixel sensors in the array for a reference period after the end of said first time period;

(5) selecting a row of the array and reading an output signal from each storage pixel sensor in the selected row; and (6) repeating step (5) until output signals for all storage pixel sensors in all rows of the array have been read.

* * * * *